(12) United States Patent
Oka et al.

(10) Patent No.: US 9,252,025 B2
(45) Date of Patent: Feb. 2, 2016

(54) METHOD FOR MANUFACTURING SILICON SINGLE CRYSTAL WAFER AND ELECTRONIC DEVICE

(71) Applicant: SHIN-ETSU HANDOTAI CO., LTD., Tokyo (JP)

(72) Inventors: Tetsuya Oka, Takasaki (JP); Koji Ebara, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/367,206

(22) PCT Filed: Dec. 14, 2012

(86) PCT No.: PCT/JP2012/008002
§ 371 (c)(1),
(2) Date: Jun. 19, 2014

(87) PCT Pub. No.: WO2013/105179
PCT Pub. Date: Jul. 18, 2013

(65) Prior Publication Data
US 2015/0001680 A1 Jan. 1, 2015

(30) Foreign Application Priority Data
Jan. 11, 2012 (JP) .................................. 2012-003509

(51) Int. Cl.
*H01L 21/322* (2006.01)
*H01L 29/16* (2006.01)

(52) U.S. Cl.
CPC ............ *H01L 21/3225* (2013.01); *H01L 29/16* (2013.01)

(58) Field of Classification Search
CPC ............................. H01L 21/3225; H01L 29/16

USPC .......................................................... 257/617
See application file for complete search history.

(56) References Cited

U.S. PATENT DOCUMENTS 5,674,756 A * 10/1997 Satoh et al. .................... 438/471
5,954,873 A 9/1999 Hourai et al.
(Continued)

FOREIGN PATENT DOCUMENTS

JP A-60-136218 7/1985
JP A-08-330316 12/1996
(Continued)

OTHER PUBLICATIONS

International Preliminary Report on Patentability issued in International Patent Application No. PCT/JP2012/008002 dated Jul. 15, 2014.
(Continued)

*Primary Examiner* — Ermias Woldegeorgis
(74) *Attorney, Agent, or Firm* — Oliff PLC

(57) ABSTRACT

According to the present invention, there is provided a method for manufacturing a silicon single crystal wafer, wherein a first heat treatment for holding a silicon single crystal wafer in an oxygen containing atmosphere at a first heat treatment temperature for 1 to 60 seconds and cooling it to 800° C. or less at a temperature falling rate of 1 to 100° C./second by using a rapid heating/rapid cooling apparatus is performed to inwardly diffuse oxygen and form an oxygen concentration peak region near a surface of the silicon single crystal wafer, and then a second heat treatment is performed to agglomerate oxygen in the silicon single crystal wafer into the oxygen concentration peak region. As a result, it is possible to provide the method for manufacturing a silicon single crystal wafer that enables forming an excellent gettering layer close to a device forming region.

11 Claims, 11 Drawing Sheets

(56) References Cited

U.S. PATENT DOCUMENTS

| | | | |
|---|---|---|---|
| 2001/0055689 A1 | 12/2001 | Park | |
| 2003/0022003 A1 | 1/2003 | Park | |
| 2003/0157341 A1* | 8/2003 | Ikezawa et al. | 428/446 |
| 2003/0157814 A1 | 8/2003 | Iida et al. | |
| 2005/0253221 A1 | 11/2005 | Takase et al. | |
| 2010/0038757 A1* | 2/2010 | Isogai et al. | 257/655 |
| 2010/0055884 A1* | 3/2010 | Isogai et al. | 438/502 |
| 2012/0001301 A1 | 1/2012 | Ebara et al. | |

FOREIGN PATENT DOCUMENTS

| | | |
|---|---|---|
| JP | A-11-116390 | 4/1999 |
| JP | A-2001-203210 | 7/2001 |
| JP | A-2002-353225 | 12/2002 |
| JP | A-2003-115491 | 4/2003 |
| JP | A-2003-297839 | 10/2003 |
| JP | A-2004-006615 | 1/2004 |
| JP | B2-3763629 | 4/2006 |
| JP | A-2009-170656 | 7/2009 |
| JP | A-2010-040587 | 2/2010 |
| JP | A-2010-212333 | 9/2010 |
| WO | WO 2010/119614 A1 | 10/2010 |

OTHER PUBLICATIONS

Office Action issued in Japanese Application No. 2012-003509 dated Apr. 8, 2014 (with partial translation).

International Search Report issued in International Application No. PCT/JP2012/008002 dated Jan. 29, 2013.

Aug. 13, 2015 Taiwanese Office Action issued in Taiwanese Application No. 102101161.

* cited by examiner

METHOD FOR MANUFACTURING SILICON SINGLE CRYSTAL WAFER AND ELECTRONIC DEVICE

BACKGROUND OF THE INVENTION

1. Field of the Invention

The present invention relates to a method for manufacturing a silicon single crystal wafer that is suitable for fabrication of an image pickup device or a memory device and to an electronic device using this method.

2. Description of the Related Art

A silicon single crystal wafer for use in a semiconductor device is generally sliced out from a silicon single crystal ingot grown by a Czochralski method (which will be referred to as a [CZ method] hereinafter) and manufactured through processes such as polishing. Request items required for this silicon single crystal wafer are formation of a defect-free layer (a Denuded Zone layer: which will be referred to as a [DZ layer] hereinafter) in a surface layer, control over solid solubility oxygen concentration that affects mechanical strength, and control over an oxide precipitate (a Bulk Micro Defect: which will be referred to as a [BMD] hereinafter) formed in the wafer to remove a metal contamination element taken in during a device process from a wafer surface layer portion.

In a general silicon single crystal wafer is present a grown-in defect such as a COP (a Crystal Originated Particle) or an OSF (Oxidation Induced Stacking Fault) nucleus (a micro defect that can be a cause of occurrence of the OSF) produced in a crystal at the stage of growing a silicon single crystal by the CZ method. Therefore, as a method for annihilating the grown-in defect in a wafer surface layer and forming a high-quality DZ layer, a nitrogen (N) added wafer subjected to a high-temperature annealing treatment in an Ar atmosphere (e.g., Patent Literature 1) has been suggested. Further, a method for growing a silicon single crystal having no grown-in defect such as a COP or a OSF nucleus present therein (which will be referred to as a perfect crystal hereinafter) by controlling growth conditions of the CZ method has been also suggested (e.g., Patent Literature 2).

Besides, there is a method for performing epitaxial growth on a silicon single crystal wafer and using an epitaxial layer as a DZ layer.

The control over BMDs is important to all devices, and it is particularly important to a solid-state image pickup device. That is because the solid-state image pickup device which is a photoelectric conversion element generates electric charges in accordance with intensity of light that has hit upon an imaging surface and converts the light into an electrical signal. Therefore, it is desirable for an electric charge amount on an imaging plane when light is shielded, i.e., when light does not strike at all to be "zero". The electric charge amount is measured as a current, and it is desirable for the current when the light is shielded, i.e., a dark current to be as small as possible. However, when metal contamination or a grown-in defect is present in a photodiode region formed in a wafer surface layer, a deep level is formed in a forbidden band of a semiconductor. As a result, electric charges are generated through a defect even though light is not applied. This is known as a generation/recombination current, and this current degrades dark current characteristics, i.e., reduces electrical characteristics of the solid-state image sensing device.

However, even though metal contamination is introduced in a solid-state image pickup device fabrication process, if a BMD is formed at a position deeper than a device forming region, the BMD removes (getters) a metal contamination element from the wafer surface layer portion, and hence degradation of the electrical characteristics can be avoided.

To getter, a higher total volume of the BMDs (which is comparable to density×a BMD size per one BMD) is desirable, and having the BMD formed at a position that is close to the device forming region as much as possible (proximity gettering) is desirable. That is because, to getter a contamination element such as a metal, the contamination element must diffuse to a position of the BMD as a getter site during a heat treatment, but a diffusion distance of the contamination element tends to be shortened with lowering of a temperature/a time of a recent device process.

On the other hand, when the BMD size is too large, the BMD itself serves as a dislocation generation source, an adverse effect, i.e., deforming a wafer during a heat treatment in device manufacturing process and a reduction in yield rate arises by lowering of a device pattern matching accuracy in a photolithography process, and hence the size must be suppressed to a predetermined size or less. As described above, it is necessary that the density and the size of the BMD are controlled in a given fixed range. This can be likewise applied to a memory device.

An intrinsic gettering method (which will be referred to as an "IG method" hereinafter) for performing an oxygen precipitation heat treatment before epitaxial growth or the like and forming a BMD in a bulk can be applied to a silicon single crystal wafer that is used for the solid-state image pickup device. However, since the IG method requires a high-temperature/long-time heat treatment, there is concern in terms of cost or concern that the metal contamination is apt to occur during the heat treatment or slip might occur due to the heat treatment. Therefore, in recent years, a wafer obtained by forming an epitaxial layer formed on the wafer sliced out from a crystal in which carbon (C) is doped at the time of growing a silicon single crystal by the CZ method is often adopted. Although a BMD is not formed in this wafer at a shipping stage as a wafer, carbon is present in the wafer, and hence the wafer has characteristics that oxygen precipitation is apt to occur at a relatively low temperature, i.e., 400 to 800° C. and the BMD is easily formed by a heat treatment in the solid-state image pickup device fabrication process.

On the other hand, in case of a memory device, a silicon single crystal wafer that is sliced out from a perfect crystal and fabricated is widely adopted. Furthermore, a structure obtained by forming a very shallow grove that is called an STI (Shallow Trench Isolation) as element isolation and filling the inside of the groove with an oxide film is adopted. However, there is a problem that since a volume of the oxide film changes during a process of annealing the oxide film buried inside, large stress is generated around the STI, and a dislocation is thereby apt to occur from a corner portion of the STI. To alleviate this stress or pin the dislocation, a BMD having high density and a precipitous profile at a position close to an STI bottom portion is effective (Patent Literature 3).

Patent Literature 1: Japanese Unexamined Patent Application Publication No. 2002-353225
Patent Literature 2: Japanese Unexamined Patent Application Publication No. Hei 08-330316
Patent Literature 3: US 2001/0055689
Patent Literature 4: Japanese Unexamined Patent Application Publication No. Hei 11-116390
Patent Literature 5: Japanese Patent No. 3763629
Patent Literature 6: Japanese Unexamined Patent Application Publication No. 2010-40587
Patent Literature 7: Japanese Unexamined Patent Application Publication No. 2009-170656

Patent Literature 8: Japanese Unexamined Patent Application Publication No. 2001-203210

Patent Literature 9: Japanese Unexamined Patent Application Publication No. 2003-297839

Patent Literature 10: WO 2010/119614

SUMMARY OF THE INVENTION

In recent years, miniaturization, sensitivity improvement, lowering of a shutter voltage of a solid-state image pickup device have advanced, a thickness of an epitaxial layer tends to be thinner, and there is a case that a thickness of the epitaxial layer is 5 μm or less. With such a reduction in film thickness of the epitaxial layer, the following new problems have emerged.

A silicon single crystal wafer for formation of an epitaxial layer is sliced out from a silicon single crystal grown by the CZ method and fabricated, concentrations of oxygen, carbon, and a dopant element (e.g., phosphor (P)) in the silicon single crystal pulled from a pulling-up furnace in the CZ method have concentric shades within a wafer plane in dependence on a fluctuation of a temperature of a silicon melt surface. The shades of the concentrations are called striation.

Among others, the striation of oxygen that forms precipitates and has a high diffusion constant is particularly arguable. When there is the striation of oxygen, since a BMD that is formed by a BMD forming heat treatment is formed by using the oxygen striation as a template, it appears as shades of the BMD in a wafer. The formed BMD is effective as a gettering source that removes the metal contamination from a surface layer but, on the other hand, it has an adverse effect that a diffusion current as a dark current is increased since a defect level is formed. When an epitaxial layer has a large thickness, since a distance between the BMD and a device forming region is large, the diffusion current is not a serious problem, but this effect cannot be ignored and becomes obvious as a problem when a thickness of the epitaxial layer is reduced. Since this problem is greatly improved when a thickness of the epitaxial layer is increased by approximately 1 μm, the BMD that adversely affects characteristics of the solid-state image pickup device is considered to be a BMD that is produced at a position that is closest to the device forming region, i.e., a position immediately below the DZ layer.

On the other hand, there is a case where oxygen in a bulk of a wafer diffuses into a DZ layer or an epitaxial layer by a heat treatment in a device manufacturing process and a small oxide precipitate or oxygen donor is formed in the epitaxial layer or the DZ layer. Both the oxide precipitate and the oxygen donor appear as shades using the oxygen striation as a template, an amount of oxygen that diffuses to a surface layer of the epitaxial layer that is a device forming region increases when a thickness of the epitaxial layer is reduced, and hence its influence becomes considerable. As a result, when the thickness of the epitaxial layer is reduced, its influence becomes obvious, and stripe image noise using the striation as the template appears in a solid-state image pickup device, thereby greatly degrading quality. Furthermore, in a memory device, an adverse effect, e.g., an increase in leak current or a change in threshold voltage of an MOS (Metal Oxide Semiconductor) transistor is brought. Therefore, it is desirable that the small BMD or oxygen donor is not present in the device forming layer and the shades of concentrations are small.

That is, reducing diffusion of oxygen from the bulk of the wafer to the epitaxial layer or the DZ layer as much as possible is desirable, or smaller oxygen striation of the wafer is desirable.

As a method for improving the oxygen striation, a method for improving a heater structure in a furnace of an apparatus according to the CZ method and reducing a fluctuation in temperature of a silicon melt surface to achieve the improvement has been suggested (Patent Literature 4). However, in this method, likewise, the striation cannot be completely eliminated, it cannot be said that this method is sufficient. Moreover, the problem that oxygen diffuses in the DZ layer or the epitaxial layer during a heat treatment in the device manufacturing process and a small BMD or oxygen donor is formed still remains.

As another problem that is caused by reducing the thickness of the epitaxial layer, there is a problem of failing to completely annihilate a COP. Usually, the COP is present in a silicon single crystal wafer that is used as a substrate of an epitaxial wafer for an image pickup device. For example, in Patent Literature 5, it is described that, in case of performing epitaxial growth under an ordinary pressure, failing to completely annihilate the COP occurs on a surface of an epitaxial layer unless a thickness of the epitaxial layer is 2 μm or more.

As a method for annihilating the COP, in Patent Literature 6, a method for performing an RTA treatment in an atmosphere of oxygen at 1300° C. or more and 1380° C. or less is suggested.

According to this method, the COP can be annihilated and oxygen can be inwardly diffused in a surface layer, but there is no description about a heat treatment after the RTA treatment, and oxygen inwardly diffused by the RTA treatment follows regular outward diffusion in a subsequent heat treatment, oxygen taken into a bulk of a silicon single crystal wafer at the stage of CZ growth diffuses to the surface as usual, and hence not only an influence of the striation cannot eliminated but also both oxygen inwardly diffused by the RTA treatment and oxygen taken into the bulk of the silicon single crystal wafer at the stage of the CZ growth are diffused to the DZ layer or the epitaxial layer during a device heat treatment. As a result, a larger amount of oxygen is taken into a device forming region than that in the silicon single crystal wafer that has not been subjected to the RTA treatment, and there arises a problem that more donors or precipitates are apt to be generated in the device forming region.

In view of the above-described problems, it is an object of the present invention to provide a method for enabling manufacture of a silicon single crystal wafer in which an excellent gettering layer close to a device forming region is formed.

To achieve this object, according to the present invention, there is provided a method for manufacturing a silicon single crystal wafer, wherein a first heat treatment for holding a silicon single crystal wafer in an oxygen containing atmosphere at a first heat treatment temperature for 1 to 60 seconds and cooling it to 800° C. or less at a temperature falling rate of 1 to 100° C./second by using a rapid heating/rapid cooling apparatus is performed to inwardly diffuse oxygen and form an oxygen concentration peak region near a surface of the silicon single crystal wafer, and then a second heat treatment is performed to agglomerate oxygen in the silicon single crystal wafer into the oxygen concentration peak region.

As described above, when oxygen is inwardly diffused in the surface layer of the silicon single crystal wafer by the first heat treatment and then the second heat treatment is performed so as to agglomerate oxygen in the wafer to the oxygen concentration peak region, the oxygen concentration peak region with the radially uniform oxygen concentration can be formed near the surface. Therefore, it is possible to manufacture the silicon single crystal wafer in which the uniform gettering layer close to the device forming region is formed.

At this time, it is preferable to set oxygen concentration of the silicon single crystal to which the first and second heat treatments are performed to $4 \times 10^{17}$ atoms/cm$^3$ (ASTM'79) or more and $16 \times 10^{17}$ atoms/cm$^3$ (ASTM'79) or less.

According to the silicon single crystal wafer having such oxygen concentration, the oxygen concentration peak region having the sufficient peak concentration can be efficiently formed by the first and second heat treatments.

At this time, it is preferable to determine conditions of the first and second heat treatments as conditions under which oxygen concentration profiles of the silicon single crystal wafer after the first heat treatment and the silicon single crystal wafer after the first and the second heat treatments or the silicon single crystal wafer subjected to an oxide precipitate actualizing heat treatment after the first and second heat treatments are previously measured and a full-width at half maximum of the oxygen concentration profile of the silicon single crystal wafer after the first and second heat treatments or the silicon single crystal wafer subjected to the oxide precipitate actualizing heat treatment after the first and second heat treatments becomes smaller than a full-width at half maximum of the oxygen concentration profile of the silicon single crystal wafer after the first heat treatment, and perform the first and second heat treatments under the determined conditions.

When the conditions for the first and second heat treatments are determined as described above and the heat treatments are carried out under the conditions, the oxygen concentration peak region having the radially uniform oxygen concentration can be surely formed near the wafer surface by the first and second heat treatments.

At this time, it is preferable to determine the conditions of the first and second heat treatments as conditions under which oxide precipitate defects are not formed on the surface of the silicon single crystal wafer after the first and second heat treatments, and perform the first and second heat treatments under the determined conditions.

When the conditions for the first and second heat treatments are determined as described above and the heat treatments are carried out under the conditions, it is possible to manufacture a more high-quality silicon single crystal wafer having no defect produced on the wafer surface by the first and second heat treatments.

As this time, it is preferable to perform the first heat treatment in an atmosphere containing oxygen of 20% or more at a first heat treatment temperature that is 1320° C. or more and a silicon melting point or less.

When the first heat treatment is performed as described above, oxygen can be efficiently inwardly diffused in the wafer surface layer.

At this time, it is preferable to perform the first heat treatment in an atmosphere containing oxygen of 0.01% or more and less than 20% at a first heat treatment temperature that is 1290° C. or more and a silicon melting point or less.

When the first heat treatment is performed in this manner, oxygen can be efficiently inwardly diffused even at a relatively low temperature.

At this time, in the second heat treatment, it is preferable to perform a precipitate nucleation heat treatment at 400 to 700° C. for 2 to 20 hours.

When such a second heat treatment is performed, the precipitation nuclei can be effectively formed in high density.

At this time, in the second heat treatment, it is preferable to perform a precipitate nucleus growth heat treatment at 800 to 1200° C. for one hour or more after the precipitate nucleation heat treatment.

When such a second heat treatment is carried out, the precipitation nuclei formed in high density can be grown and effectively stabilized.

At this time, it is preferable to form an epitaxial layer on a surface of the silicon single crystal wafer after the first and second heat treatments.

When the epitaxial wafer is fabricated in this manner, it is possible to manufacture the wafer in which the oxygen concentration peak region having high density is provided immediately below the epitaxial layer and an oxygen precipitation defect is not formed in the epitaxial layer.

Additionally, there is provided an electronic device, wherein the electronic device is formed on a surface of the epitaxial layer of a silicon single crystal wafer manufactured by the method for manufacturing a silicon single crystal wafer according to the present invention.

According to such an electronic device, there is provided the high-quality electronic device in which the device forming region has not defect and the excellent gettering layer is formed immediately below the device forming region.

As described above, according to the present invention, the uniform oxygen concentration peak region having high concentration can be formed near the surface of the silicon single crystal wafer. Therefore, the excellent gettering layer close to the device forming region is formed, and the device forming region is not adversely affected.

DETAILED DESCRIPTION OF THE PREFERRED EMBODIMENTS

Figure 1:
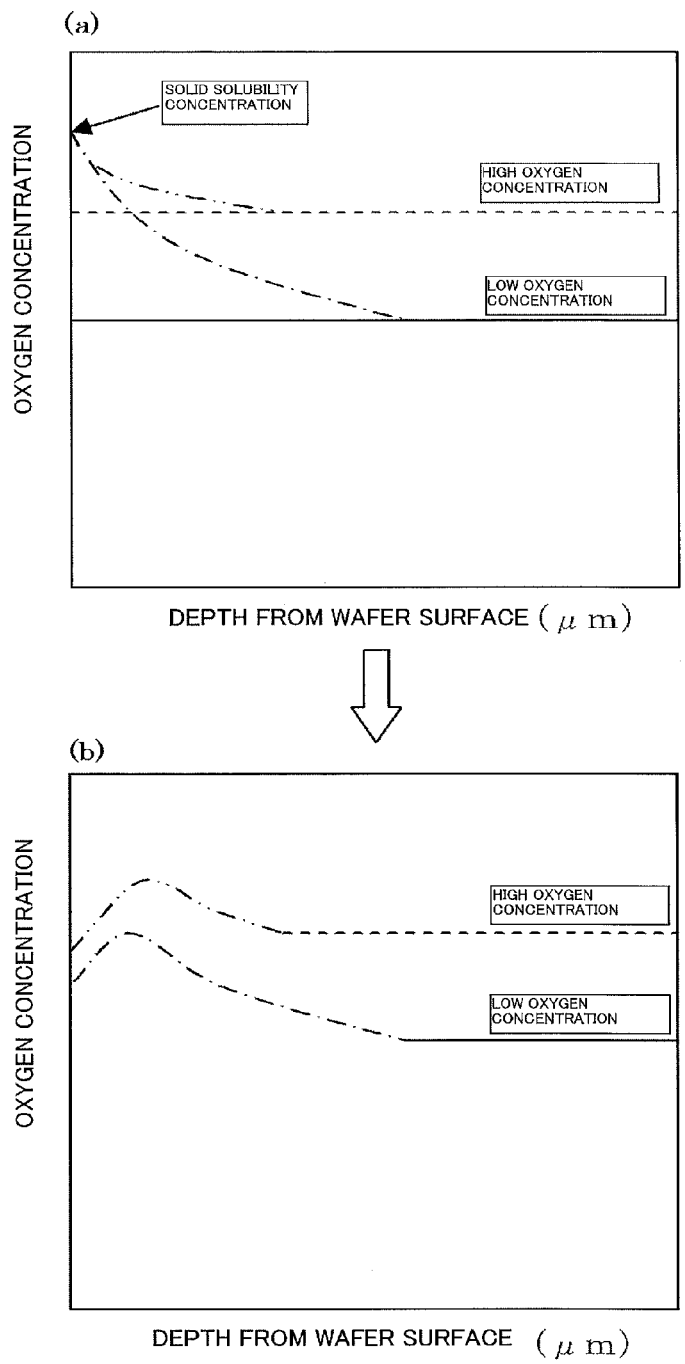
FIG. 1(a) is a graph of a depth of a wafer and oxygen concentration when oxygen is inwardly diffused by an RTA treatment.
FIG. 1(b) is a graph of a depth of the wafer and the oxygen concentration after lowering a temperature.

The present inventors keenly examined a method for forming an oxygen concentration peak region having high concentration near a wafer surface.

First, oxygen was introduced into a silicon single crystal wafer by a rapid heat treatment (RTA: Rapid Thermal Anneal) in an oxygen containing atmosphere, then a heat treatment was conducted in various temperature regions, and an oxygen concentration profile and a BMD were evaluated.

In addition, it has been already reported that oxygen inwardly diffuses in the wafer by the RTA treatment in the oxygen containing atmosphere. For example, Patent Literature 7 has a description of a method for raising oxygen concentration in a surface layer by performing the RTA treatment in an oxidizing atmosphere and introducing oxygen to the surface layer in order to solve a problem that COPs can be annihilated by performing annealing at 1100 to 1300° C. with respect to a silicon single crystal wafer in which COPs as grown-in defects are present in an entire bulk and thereby a DZ layer having no COP in a surface layer can be formed but strength of the surface layer is lowered since oxygen outwardly diffuses from the surface at the same time.

Further, there is also a description that, since oxygen further outwardly diffuses by a subsequent heat treatment and the oxygen concentration in the surface layer is again lowered, a DZ layer having no BMD down to 20 μm in the surface layer is formed. This point is similar to Patent Literature 6, and oxygen basically shows regular diffusion behavior.

As obvious from these descriptions, a common view is that since oxygen generally outwardly diffuses by the heat treatment, the oxygen concentration in the surface layer is lowered, and the DZ layer is formed in the surface layer.

In regard to this point, as a result of evaluating the oxygen concentration profile and the BMD, the present inventors confirmed that the oxygen concentration profile of "as RTA" (after the RTA treatment) under the oxygen containing atmosphere has a peak at a depth of approximately 1 μm to 3 μm. However, the present inventors found out a negative diffusion phenomenon, namely, when a heat treatment is subsequently performed at a given temperature or a lower temperature, a width of the oxygen concentration profile of as RTA is narrowed, the oxygen concentration profile becomes precipitous, and peak oxygen concentration is increased, i.e., oxygen apparently diffuses at a peak position with high concentration within the wafer, thereby bringing the present invention to completion.

The negative diffusion phenomenon will now be described.

A silicon single crystal wafer having peak oxygen concentration of $1.28 \times 10^{18}/cm^3$ at a depth position of approximately 2 μm from a wafer surface was formed by the RTA treatment in the oxygen containing atmosphere, and then a sample A subjected to a heat treatment at 600° C. for four hours and a sample B subjected to a heat treatment at 800° C. for four hours were prepared. Subsequently, both the samples were subjected to a heat treatment at 800° C. for four hours and then to a heat treatment at 1000° C. for 16 hours, and BMDs on their cross sections were observed after etching. At the same time, depth direction profiles of the oxygen concentration were measured by SIMS (Secondary Ion Mass Spectrometer).

As a result, in the sample A, a high-density BMD layer was formed at a position of a depth 2 μm, and its peak oxygen concentration was $4 \times 10^{18}/cm^3$ which was a higher peak concentration than that of the as RTA. Further, it was discovered that a full-width at half maximum of a peak oxygen concentration distribution of the sample A was 1.45 μm which was narrower than 2.90 μm of the as RTA. In a usual diffusion phenomenon, when a material having a peak in a concentration distribution is subjected to a heat treatment, peak concentration gradually decreases with the heat treatment, and a full-width at half maximum of the peak increases, but the above is a phenomenon that is completely opposite to this phenomenon. This means that oxygen in the wafer agglomerates at a position with high concentration (an oxygen concentration peak region), and which apparently represents the negative diffusion phenomenon.

When oxygen agglomerates at a position with high concentration in the wafer, if saying converse, this phenomenon means that oxygen diffusion from a peak oxygen concentration position formed by the RTA treatment toward the surface side can be suppressed.

On the other hand, in case of the sample B, a peak of oxygen concentration observed in the as RTA was annihilated, and an oxygen profile based on general oxygen diffusion was obtained. Furthermore, no BMD was formed at a position of a depth 2 μm from the surface.

This phenomenon can be considered as follows.

Solid solubility concentration of oxygen at a temperature of 600° C. is $1.5 \times 10^{14}/cm^3$. On the other hand, oxygen peak concentration in the wafer of as RTA is $1.28 \times 10^{18}/cm^3$, which means that a precipitation heat treatment was executed under a condition that a degree of supersaturation (=peak concentration/solid solubility concentration) is approximately 8500 times.

An oxygen precipitation reaction is considered as follows:

$$2Si + 2O + V \rightarrow SiO_2 + ISi \tag{1}$$

where Si: silicon, O: oxygen, V: vacancy, and ISi: interstitial silicon.

As obvious from the reaction formula of (1) and classical homogeneous nucleation, when the oxygen concentration is high, i.e., when the degree of supersaturation is high, a precipitation reaction rate, i.e., a precipitation nucleation rate increases.

When precipitation nuclei (or precipitates) are formed, since oxygen concentration around the nuclei is lowered, the surrounding oxygen locally diffuses toward the precipitation nuclei and is consumed by the precipitates, thereby growing the precipitation nuclei. At the same time, since oxygen outwardly diffuses from the surface during a heat treatment, the oxygen concentration on the surface is lowered, and oxygen diffuses toward the surface. When the precipitation nuclei have small density, an amount of oxygen that contributes to growth of the precipitation nuclei is relatively small, a large part of oxygen diffuses toward the surface with low concentration and is discharged from the surface without being consumed by the precipitates. However, it can be considered that, when the degree of supersaturation becomes a given value or more, oxygen changes its phase to a precipitate layer before diffusion. As a result, a high-density oxide precipitate layer (which will be referred to as an HD-BMD layer hereinafter) is formed. Consequently, an amount of oxygen consumed by growth of the precipitate increases, and a concentration difference around the precipitate produced by the growth of the precipitate becomes higher than a concentration difference produced in outer diffusion between the surface and a bulk, and oxygen no longer outwardly diffuses. Alternatively, the outer diffusion becomes very small, a large amount of oxygen diffuses toward the precipitate, and oxygen is secured to (consumed by) the oxide precipitate. As a result, it can be considered that oxygen in the wafer agglomerates (inversely diffuses) to a peak position of concentration, i.e., the HD-BMD layer. This phenomenon is considered to be proportionate to easiness of oxygen precipitation. Since easiness of oxygen precipitation is proportionate to the degree of supersaturation of oxygen or vacancy concentration at a given heat treatment temperature, it can be considered that the similar effect is produced when the vacancy concentration is high even though the degree of supersaturation is small.

An embodiment according to the present invention will now be described hereinafter in detail with reference to the drawings, but the present invention is not restricted thereto.

The present invention provides a method for manufacturing a silicon single crystal wafer wherein a silicon single crystal wafer is subjected to a first heat treatment for holding the silicon single crystal wafer in an oxygen containing atmosphere at a first heat treatment temperature for 1 to 60 seconds and then cooling it to 800° C. or less at a temperature falling rate of 1 to 100° C./second by using a rapid heating/rapid cooling apparatus and thereby inwardly diffusing oxygen to form an oxygen concentration peak region near a surface of the silicon single crystal wafer, and subsequently the silicon single crystal wafer is subjected to a second heat treatment for agglomerating oxygen in the silicon single crystal wafer to the oxygen concentration peak region. Each process will now be described hereinafter in detail.

(a) Starting Material

As a silicon single crystal wafer subjected to heat treatments in the present invention, it is possible to use a silicon single crystal wafer fabricated from a silicon single crystal ingot grown by the CZ method or the FZ method or an epitaxial wafer having an epitaxial layer formed on the silicon single crystal wafer.

For example, it is possible to use a single-side polished wafer (which will be referred to as an SSP wafer hereinafter) formed by slicing a silicon single crystal ingot grown by the CZ method to provide a wafer, subsequently performing chamfering, lapping, and etching, and then mirror-polishing one surface of the wafer or a double-side polished wafer (which will be referred to as a DSP wafer hereinafter) formed by performing double-side polishing to front and back sides of a wafer and then carrying out final mirror polishing to one main surface. Alternatively, it is also possible to use a wafer that has been through the double-side polishing in the manufacturing process without the final mirror polishing (which will be referred to as a DSP wafer before final polishing hereinafter).

At this time, it is desirable to set oxygen concentration of the silicon single crystal wafer subjected to first and second heat treatments in the present invention to $4 \times 10^{17}$ atoms/cm³ (ASTM'79) or more or preferably $8 \times 10^{17}$ atoms/cm³ (ASTM'79) or more and $16 \times 10^{17}$ atoms/cm³ (ASTM'79) or less.

When the silicon single crystal wafer having such oxygen concentration is adopted, an oxygen concentration peak region with high concentration can be formed by the heat treatments, and occurrence of defects on the surface can be effectively avoided.

(b) First Heat Treatment (Oxygen Inward Diffusion Heat Treatment Process)

The above-described silicon single crystal wafer is subjected to the first heat treatment for holding the silicon single crystal wafer in an oxygen containing atmosphere at a first heat treatment temperature for 1 to 60 seconds and then cooling the same to 800° C. or less at a temperature falling rate of 1 to 100° C./second by using a rapid heating/rapid cooling apparatus, and oxygen is thereby inwardly diffused to form an oxygen concentration peak region near a surface of the silicon single crystal wafer.

When a temperature is rapidly increased in the oxygen containing atmosphere and the heat treatment is performed for 1 to 60 seconds, oxygen is inwardly diffused from the wafer surface during the heat treatment so as to provide oxygen solid solubility concentration at this heat treatment temperature, and an oxygen concentration distribution having a simple attenuation profile according to a diffusion constant of oxygen from the surface along a depth direction is formed. Then, oxygen outwardly diffuses from the surface and the oxygen concentration on the surface side is lowered while the temperature is rapidly lowered to 800° C. or less at a temperature falling rate of 1° C./second or more and 100° C./second or less, and a profile having an oxygen concentration peak (an oxygen concentration peak region) at a depth position that is approximately 1 µm from the surface can be formed. Peak concentration and a peak position can be controlled by using a holding temperature, a time, and a temperature falling rate in the heat treatment and the oxygen concentration in the wafer. The temperature is lowered at the temperature falling rate of 1° C./second or more in terms of productivity, and slip may possibly occur when the temperature falling rate exceed 100° C./second.

Such a first heat treatment will now be more specifically described hereinafter.

FIG. 1(a) shows a conceptual view when each of a high-oxygen concentration silicon single crystal wafer and a low-oxygen concentration silicon single crystal wafer was heated and held in a rare gas atmosphere containing oxygen and oxygen was inwardly diffused from each wafer surface. In FIG. 1(a), a solid line and a dotted line indicate oxygen concentration distributions of the low-oxygen concentration wafer and the high-oxygen concentration wafer before the oxygen inward diffusion heat treatment, respectively, and a dashed dotted line and a dashed-two dotted line indicate concentration distributions of oxygen that inwardly diffuses while the low-oxygen concentration wafer and the high-oxygen concentration wafer are held at the first heat treatment temperature, respectively.

In the first heat treatment (the oxygen inward diffusion heat treatment), holding is performed in an oxygen gas or a rare gas (e.g., Ar or $N_2$) containing oxygen for 1 to 60 seconds. During this holding, in a state that oxygen concentration on the surface of the silicon single crystal wafer maintains solid solubility concentration $C_0$ given by the following Expression (2), oxygen inwardly diffuses in accordance with the diffusion constant of oxygen at a holding temperature (the dashed dotted line or the dashed-two dotted line in FIG. 1(a)).

$$C_0 = 9 \times 10^{22} \times \mathrm{Exp}(-1.52/kT) \quad (2)$$

where k: a Boltzmann's constant, and T: an absolute temperature (K).

Since oxygen solid solubility limit concentration increases as the temperature rises, an amount of oxygen that diffuses into a bulk increases as the heat treatment temperature rises. Further, since the diffusion is proportionate to a difference between oxygen concentration on the surface (solid solubility concentration) and oxygen concentration in the wafer (the bulk), an oxygen concentration profile to be obtained is a function of a heat treatment temperature, oxygen concentration of the wafer, and a heat treatment time.

Furthermore, after each wafer is heated and held for a fixed time, when the temperature is lowered to 800° C. or less at a temperature falling rate of 1 to 100° C./second, part of oxygen in the wafer is discharged from the surface by outward diffusion during lowering of the temperature. As a result, like a conceptual view shown in FIG. 1(b), the oxygen concentration profile has a shape having a peak at a given depth from the surface layer (the dashed dotted line and the dashed-two dotted line in FIG. 1(b)). That is, an oxygen concentration peak region is formed.

If the temperature falling rate is as high as 1 to 100° C./second, a decrease in amount of oxygen due to the outward diffusion of oxygen from the wafer surface can be reduced, more vacancies (high concentration) can be frozen (=injected) in the bulk, and hence an advantage that oxygen precipitation can be facilitated is provided.

Here, peak concentration and its position can be controlled based on the first heat treatment temperature (the oxygen inward diffusion heat treatment temperature), a holding time, oxygen concentration in the wafer, and the temperature falling rate and can be appropriately determined so that a desired profile can be provided.

If such a first heat treatment temperature (an RTA treatment temperature) is, e.g., 1320° C. or more, COPs can be annihilated and, at the same time, grown-in oxide precipitates can be completely annihilated (see, e.g., Patent Literature 10). Therefore, even if a wafer with grown-in defects is used, a DZ layer can be formed in a surface layer of this wafer by the first heat treatment, and an advantage that a cost of a crystal can be reduced is provided.

Moreover, the first heat treatment can be carried out in an atmosphere containing oxygen of 20% or more at the first heat treatment temperature that is 1320° C. or more and a silicon melting point (approximately 1410° C.) or less.

It has been conventionally considered that, since interstitial silicon is injected into a wafer by the RTA treatment in an atmosphere containing oxygen of 20% or more, oxygen precipitation is suppressed, and an HD-BMD layer is hard to be formed. However, the present inventors discovered a phenomenon that, when a treatment temperature is 1320° C. or more even in the RTA treatment in the atmosphere containing oxygen of 20% or more, subsequent oxygen precipitation is facilitated. Although its reason is not clear, it can be considered that vacancies are injected in the RTA treatment at 1320° C. or more. When subsequent precipitation is facilitated by injection of the vacancies in this manner, the HD-BMD layer can be further easily formed, which is advantageous. Moreover, when the RTA treatment is performed at a high temperature of 1320° C. or more, an oxygen concentration profile having peak concentration of $9 \times 10^{17}$ atoms/cm$^3$ or more can be obtained. Therefore, in the second heat treatment, when the heat treatment is performed at a temperature of, e.g., 400° C. to 700° C. that oxide precipitate nuclei can be most readily formed, a sufficient degree of supersaturation of oxygen is provided, thereby effectively forming the HD-BMD layer.

Additionally, the first heat treatment can be carried out in an atmosphere containing oxygen of 0.01% or more and less than 20% at the first heat treatment temperature of 1290° C. or more and the silicon melting point or less.

When a rare gas atmosphere (e.g., Ar) having oxygen concentration of 0.01% or more and less than 20% is used, subsequent oxygen precipitation is facilitated even at 1290° C. that is a lower temperature than that when oxygen of 100% is used. That is, since vacancies are effectively injected at an RTA temperature that is lower than that in case of the atmosphere containing oxygen of 100%, it is possible to obtain the same oxygen precipitation at a lower RTA temperature as that obtained in the 100% oxygen at a higher RTA temperature, thereby realizing a reduction in temperature of the process.

It is to be noted that, as the rapid heating/rapid cooling apparatus used in the present invention, a single-wafer processing type or batch type RTA apparatus can be adopted and a commercially available RTA apparatus (e.g., Helios manufactured by Mattson) can be also used.

(c) Second Heat Treatment (Oxygen Securing Heat Treatment Process)

When the second heat treatment is performed after the first heat treatment, oxygen in the silicon single crystal wafer is agglomerated in the oxygen concentration peak region.

When oxygen is agglomerated in the oxygen concentration peak region and oxide precipitate nuclei are formed and grown in this manner, a high-concentration oxygen precipitation layer (the HD-BMD layer) is formed near the wafer surface.

In this second heat treatment, it is preferable to perform a precipitate nucleation heat treatment at 400 to 700° C. for 2 to 20 hours.

When the precipitate nucleation heat treatment is performed at such a temperature for such a time, precipitate nuclei can be formed without annihilating an oxygen concentration peak near the surface, and oxygen can be effectively agglomerated in the oxygen concentration peak region.

Further, after the precipitate nucleation heat treatment, it is preferable to carry out a precipitate nucleus growth heat treatment at 800 to 1200° C. for one hour or more.

In this manner, when the precipitate nucleus growth heat treatment at a higher temperature is performed after the precipitate nucleation heat treatment, since oxygen can be further effectively agglomerated in the oxygen concentration peak region, precipitate nuclei formed in the bulk can be grown and stabilized.

According to this second heat treatment, the heat treatment can be performed with the use of a commercially available vertical heat treatment apparatus or horizontal heat treatment apparatus. As an atmospheric gas, it is possible to use any one of $O_2$, $N_2$, Ar, or a mixed gas of these materials, or an $H_2$ gas.

The oxygen precipitation phenomenon is a very complicated phenomenon that is determined by a degree of supersaturation of oxygen, concentration of point defects, and impurity concentration of C or N, and conditions for forming the HD-BMD layer are a function of all these factors, and the conditions cannot be uniquely determined. In particular, among point defects, vacancies are known to facilitate formation of an oxide precipitate, and vacancy concentration greatly varies depending on an atmosphere or a temperature of the RTA treatment.

For example, vacancies are injected in the RTA treatment performed in an $NH_3$ atmosphere, vacancy concentration to be injected increases as a maximum temperature in the RTA treatment rises, and vacancy concentration also increases as the temperature falling rate rises (e.g., Patent Literature 8). Contrary, it has been reported that interstitial silicon that suppresses oxygen precipitation is injected in the RTA treatment performed in an $O_2$ atmosphere (e.g., Patent Literature 9).

Thus, in the present invention, it is preferable to previously check conditions of the first heat treatment and the second heat treatment under which an oxygen concentration peak region is formed and oxygen is agglomerated in this region by a preliminary experiment as follows.

For example, wafers to which various oxygen concentrations are assigned are prepared, and a sample 1 subjected to a heat treatment while changing first heat treatment conditions (an atmospheric gas, a temperature, a holding time, and a temperature falling rate) and a sample 2 subjected to the heat treatment applied to the sample 1 and another heat treatment while changing second heat treatment conditions (a temperature and a time) are prepared. In this case, the second heat treatment may be performed in two stages, i.e., the precipitate nucleation forming heat treatment and the precipitate nucleus growth heat treatment, or still another heat treatment may be carried out.

Additionally, when the first heat treatment and the second heat treatment are not enough, a diffusion distance of oxygen is too small and a difference is hard to find. In this case, it is desirable to prepare a sample 3 subjected to the heat treatment under the heat treatment conditions for the sample 2 and also, e.g., an oxide precipitate actualizing heat treatment for actualizing an oxide precipitate by holding the sample at 800° C. for four hours, then increasing the temperature to 1000° C., holding the sample at 1000° C. for 16 hours.

Then, an oxygen concentration profile in a depth direction of each sample is measured, and the oxygen concentration profile having a first region that increases from a value on a main surface and a second region that decreases from a maximum value in the first region, and a width (a full-width at half maximum) between a position at which oxygen concentration in the first region becomes ½ of the maximum value and a position at which oxygen concentration in the second region becomes ½ of the maximum value is obtained. Furthermore, it is preferable to obtain a combination of the first heat treatment conditions and the second heat treatment conditions that reduces the full-width at half maximum of the sample 2 or the sample 3 to be smaller than the full-width at half maximum of the sample 1 and carry out the first heat treatment and the second heat treatment under the combined conditions.

Alternatively, it is preferable to selectively etch the sample 2 (subjected to the first heat treatment and the second heat treatment), obtain a combination of the first heat treatment conditions and the second heat treatment conditions by which defects do not appear on the surface, and perform the first heat treatment and the second heat treatment under the combined conditions.

Alternatively, it is most preferable to obtain a combination of the first heat treatment conditions and the second heat treatment conditions that enables the full-width at half maximum of each sample to meet the above-described conditions and prevents surface defects from appearing and then carry out the first heat treatment and the second heat treatment under the combined conditions.

When the first heat treatment and the second heat treatment are performed under the thus determined conditions, the uniform HD-BMD layer with high density can be formed at a depth of approximately 1 μm from the surface layer without having defects on the surface, and the silicon single crystal wafer in which outward diffusion of oxygen from the wafer is extremely suppressed on the surface side of the HD BMD layer can be fabricated.

It is to be noted, in the preliminary experiment, the preliminary experiment may be conducted under the second heat treatment conditions as heat treatment conditions of the device manufacturing process and the first heat treatment conditions may be determined. In this case, when the second heat treatment is omitted, the first heat treatment alone is carried out, and shipping as a wafer is effected, the uniform HD-BMD layer with high density can be formed at a depth of approximately 1 μm from the wafer surface layer by the heat treatment in the device manufacturing process. Moreover, there can be provided an advantage that the outward diffusion of oxygen from the wafer is greatly suppressed on the surface side of the HD-BMD layer, aimed quality can be assured, and a heat treatment cost can be greatly suppressed.

(d) Oxide Film Removal Cleaning Process

After the second heat treatment (after the first heat treatment if the second heat treatment is omitted), to remove oxide films formed on a front side and a back side of the wafer, the wafer is immersed in a cleaning tank filled with an HF aqueous solution having concentration of 5% by using, e.g., a commercially available wet cleaning apparatus, thereby removing the oxide films. Then, so-called RCA cleaning (the wafer is immersed in an SC1 cleaning tank and an SC2 cleaning tank in the mentioned order) can be continuously performed.

According to the present invention, although the heat treatments of the present invention can be performed with respect to the wafer after the epitaxial growth as described above, as a silicon single crystal wafer that is subjected to the heat treatment in the process (a) in the present invention, a wafer other than an epitaxial wafer may be prepared, and an epitaxial layer may be formed on a surface of the wafer after the heat treatments of the present invention that has been through the processes (b) to (d). As a result, it is possible to manufacture the epitaxial wafer in which occurrence of defects in the epitaxial layer is suppressed and the uniform HD-BMD layer with high density is formed at a depth of approximately 1 μm under the epitaxial layer.

It is to be noted that, if the DSP wafer before final polishing is used as a starting material, a process of performing final mirror polishing with respect to one main surface may be performed before the epitaxial growth process as required.

In this case, it is preferable to form the epitaxial layer on the surface of the silicon single crystal wafer having resistivity of 5 mΩcm or less.

Dopant concentration of the wafer having such resistivity is as very high as $1 \times 10^{19}/cm^3$ or more. Moreover, in case of growing the epitaxial layer usually having resistivity of approximately 5 Ωcm (dopant concentration is approximately $1 \times 10^{16}/cm^3$) thereon, a lattice constant of the wafer containing a dopant, e.g., P (phosphor) having an ion radius larger than that of Si at high concentration is larger than a lattice constant of the epitaxial layer. Therefore, a misfit dislocation is apt to occur due to lattice mismatch. However, in the silicon single crystal wafer having the HD-BMD layer formed on the surface layer by the heat treatment like the present invention, since BMDs that are present in the surface layer at high density alleviate stress caused due to a difference between the lattice constants, the misfit dislocation that occurs during the epitaxial growth can be suppressed.

According to the above-described present invention, the shallow DZ layer can be formed in the surface layer, and precipitous BMDs with high density can be radially uniformly formed with a narrow width of approximately 2 μm immediately below the DZ layer. This BMD density is higher than that of the BMDs formed in the bulk by oxygen taken in during growth of the silicon single crystal, and the BMDs are formed between bulk BMDs and a device forming region. Therefore, it is possible to block an influence of a BMD density distribution having a radially non-uniform stripe pattern using the oxygen striation of the bulk as a template relative to a device and fabricate a device having radially uniform characteristics.

Additionally, when the BMDs with high density are formed in the entire bulk, precipitates become excessive so that a warp of the wafer can be induced, but forming the BMD layer that has high density but a small width of a formed layer like the present invention results in an advantage that a total amount of precipitates in the overall wafer is small and occurrence of the warp due to an excess of precipitates can be suppressed.

Further, during the device heat treatment, oxygen from the bulk of the wafer can be prevented from diffusing into the DZ layer or the epitaxial layer. As a result, since it is possible to suppress diffusion of oxygen in the wafer into the DZ layer or the epitaxial layer and formation of micro oxide precipitates or transformation of oxygen into a donor, degradation of device characteristics can be avoided.

Further, stress in an STI bottom portion used for element isolation of a device can be alleviated by precipitous BMDs formed immediately below the DZ layer or the epitaxial layer, and occurrence of slip can be suppressed.

EXAMPLES

Although the present invention will now be more specifically described hereinafter based on examples and comparative examples, the present invention is not restricted thereto.

Example 1

Comparative Example 1

A p-type silicon single crystal ingot having oxygen concentration of $6.5 \times 10^{17}$ atoms/cm$^3$ and resistivity of 20 Ωcm was grown by the CZ method and sliced into a wafer shape, subjected to chamfering, lapping, and etching, then etched wafer was subjected to double-side polishing on both front and back sides thereof, and one main surface of double-side polished wafer was subjected to final mirror polishing. As a result, each double-side polished wafer (a DSP wafer) having a diameter of 12 inches (300 mm) and a thickness of 775 μm was prepared.

Subsequently, a commercially available RTA apparatus (Helios manufactured by Mattson) was used to perform a rapid heating/rapid cooling heat treatment (the RTA treatment), i.e., an oxygen inward diffusion heat treatment for increasing a temperature from a room temperature to 1350° C. in a 100% oxygen atmosphere at a temperature increasing rate of 50° C./second, holding the wafers for 10 seconds, and then lowering the temperature to 800° C. at a temperature falling rate of 30° C./second with respect to the plurality of DSP wafers, and one wafer was sampled and determined as a sample 1.

Then, a commercially available vertical furnace (VERTEX-III manufactured by Kokusai Electric Inc.) was used with respect to the wafers subjected to the RTA treatment (the oxygen inward diffusion heat treatment), the inside of the furnace was filled with an N$_2$ gas atmosphere having oxygen concentration of 5%, heat treatment temperatures of 400° C., 500° C., 600° C., 700° C., and 800° C. were assigned, and each pair of wafers was held for four hours (an oxygen securing heat treatment) and then taken out. A first one of each pair of wafers was determined as a sample 2. A second wafer was put into the furnace held in the N$_2$ gas atmosphere having oxygen concentration of 5% at 600° C. by using the commercially available vertical furnace (VERTEX-III manufactured by Kokusai Electric Inc.), a temperature was increased to 800° C. at 5° C./minute, the sample was held at 800° C. for four hours, the temperature was increased to 1000° C. at 5° C./minute, then an oxide precipitate actualizing heat treatment for holding the wafer for 16 hours was added, the temperature was lowered to 600° C. at 3° C./minute, and the wafer was taken out of the furnace and determined as a sample 3.

Moreover, the sample 2 was subjected to selective etching, whether defects were produced on the surfaces was checked, but the surface defects were not detected from all the samples.

Additionally, an oxygen concentration distribution of the sample 1 in a depth direction was measured by the SIMS, an oxygen concentration distribution of the sample 3 in the depth direction was measured by the SIMS and a BMD distribution of the sample 3 in the depth direction was observed based on selective etching of a cross section.

Figure 2:
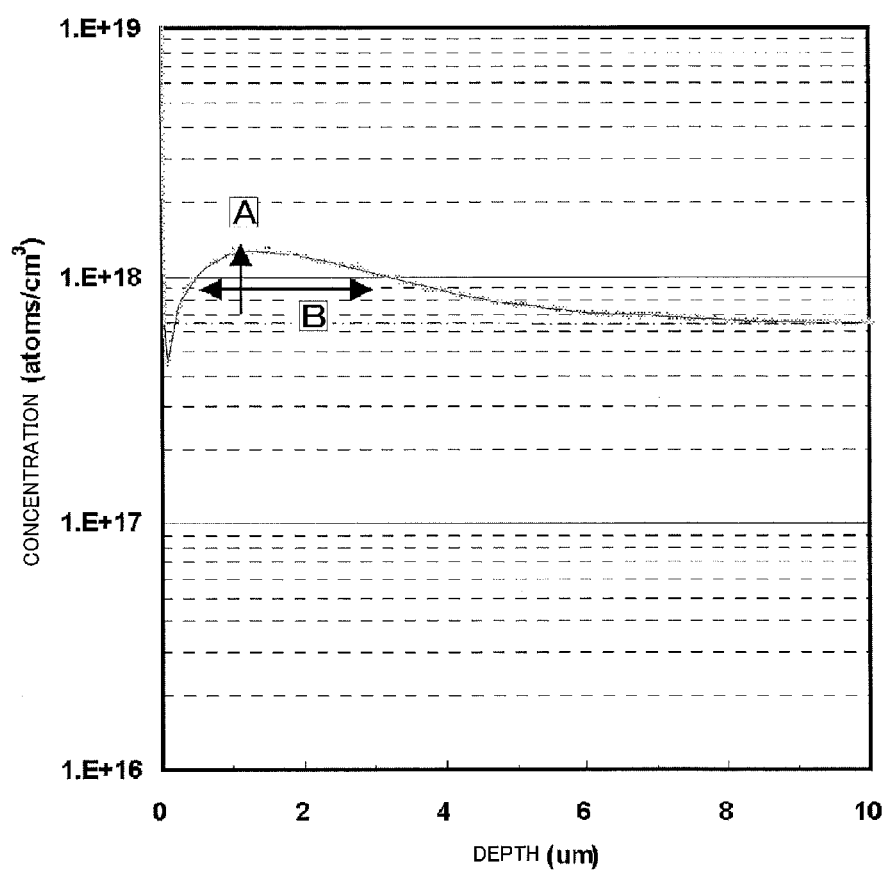
FIG. 2 shows a depth direction profile of oxygen concentration of a sample 1 (after an oxygen inward diffusion heat treatment based on a rapid heating/rapid cooling heat treatment) in each of Example 1 and Comparative Example 1.

FIG. 2 is a depth direction profile of the oxygen concentration of the sample 1 (after the oxygen inward diffusion heat treatment based on the rapid heating/rapid cooling heat treatment). A distribution having peak concentration at a depth of approximately 1 μm from the surface is shown, peak concentration is $1.28 \times 10^{18}$ atoms/cm$^3$, and a full-width at half maximum (B in the drawing) with which a height of the peak concentration (A in the drawing) is reduced to ½ is 2.90 μm.

Figure 3:
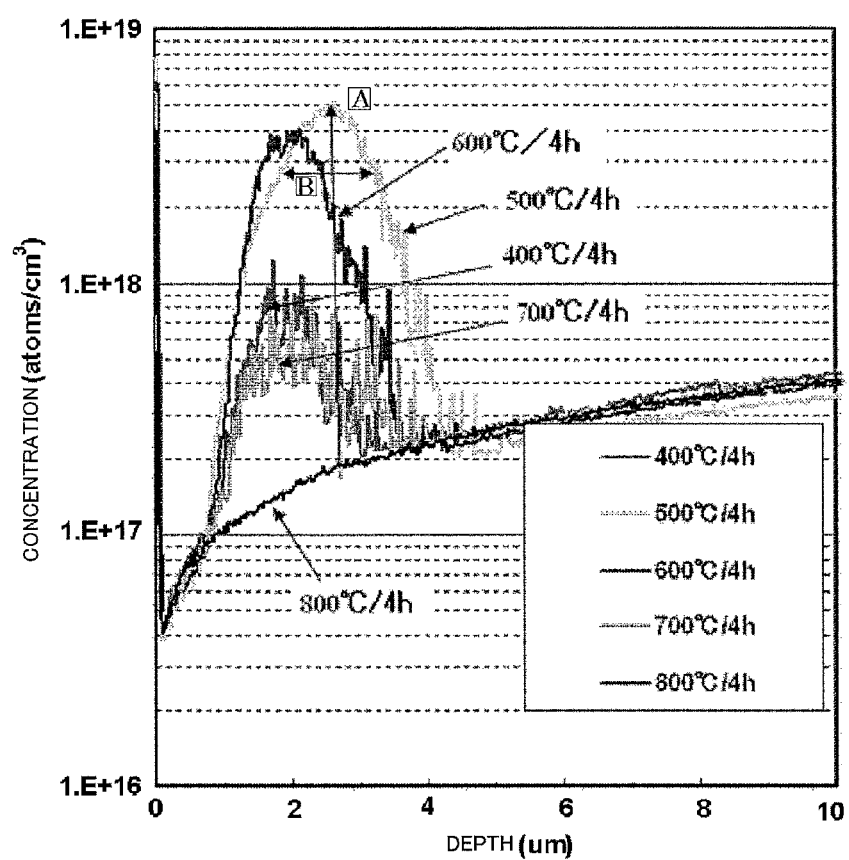
FIG. 3 shows a depth direction profile of oxygen concentration of a sample 3 (after performing the rapid heating/rapid cooling heat treatment, an oxygen securing heat treatment, and an oxide precipitate actualizing heat treatment) in each of Example 1 and Comparative Example 1.

FIG. 3 shows a depth direction profile of oxygen concentration of the sample 3 (after performing the rapid heating/rapid cooling heat treatment, the oxygen securing heat treatment, and oxide precipitate actualizing heat treatment). When an oxygen securing heat treatment temperature is 400° C. to 700° C., a distribution having a clear oxygen concentration peak is obtained at a position of a depth of approximately 2 μm. Full-width at half maximum with which a height of the peak oxygen concentration is reduced to ½ are 1.1 μm, 1.5 μm, 1.0 μm, and 1.1 μm at 400° C., 500° C., 600° C., and 700° C., respectively, and each of these values is smaller than a full-width at half maximum 2.90 μm of the sample 1 of "as RTA". Therefore, it can be understood that oxygen in the wafer gathers at a peak position of oxygen introduced by the RTA treatment at the oxygen securing heat treatment temperature 400 to 700° C. That is, it can be understood that outward diffusion of oxygen is suppressed. On the other hand, when the heat treatment is carried out at 800° C., a peak of the oxygen concentration profile is annihilated, and a so-called a profile according to the outward diffusion is provided.

As a result of observing BMDs on the cross section of the sample 3, precipitous BMD are formed with high density at a position of a depth of approximately 2 μm from the wafer surface in a narrow region having a width of approximately 3 μm when the oxygen securing heat treatment is carried out at 400° C., 500° C., 600° C., and 700° C., but BMDs were formed at a position deeper than approximately 20 μm from the wafer surface when the oxygen securing heat treatment was performed at 800° C.

In general, the BMDs are proportionate to the oxygen concentration distribution, and the oxygen concentration has a precipitous peak portion when the oxygen securing heat treatment is performed at 400° C., 500° C., 600° C., and 700° C., respectively, but the oxygen concentration gradually increases in the depth direction when the oxygen securing heat treatment is performed at 800° C., and it can be understood that a BMD distribution also gradually changes and does not have a peak portion.

Figure 4:
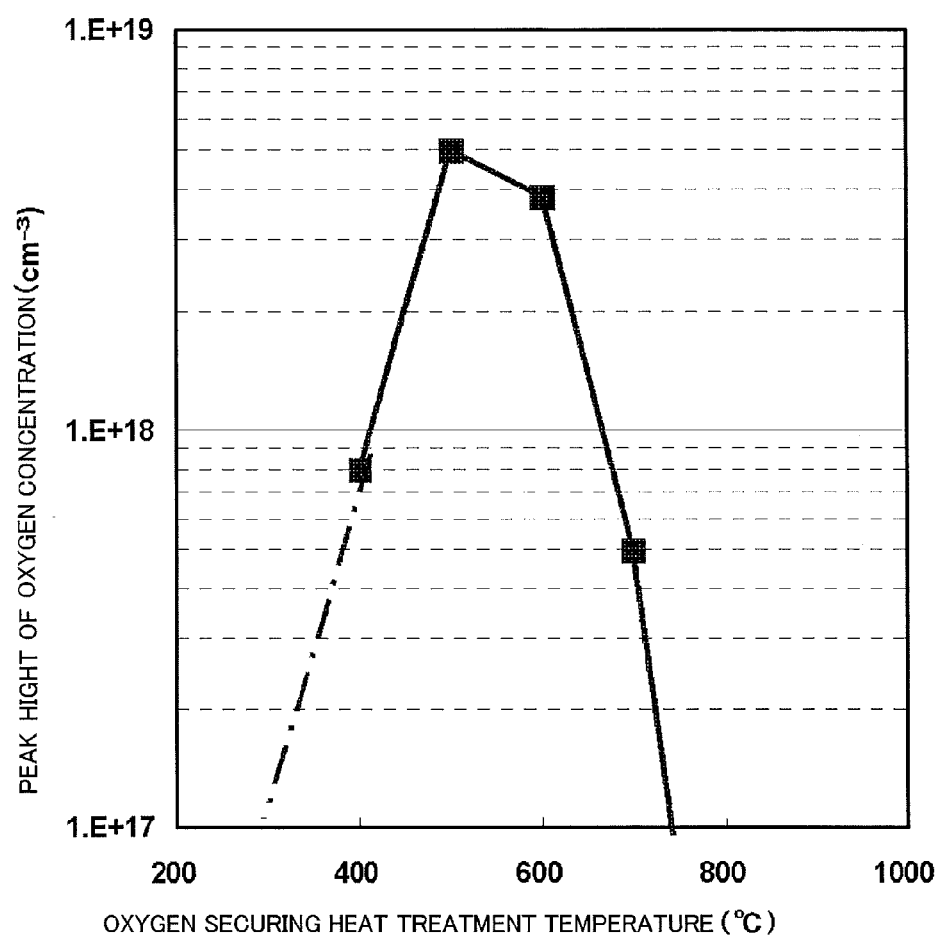
FIG. 4 is a graph showing oxygen securing heat treatment temperature dependence of a peak height of oxygen concentration of the sample 3 (after performing the rapid heating/rapid cooling heat treatment, the an oxygen securing heat treatment, and the oxide precipitate actualizing heat treatment) in each of Example 1 and Comparative Example 1.

FIG. 4 shows oxygen securing heat treatment temperature dependence of a peak height of the oxygen concentration of the sample 3. As obvious from FIG. 4, if a temperature at a precipitate nucleation step in the oxygen securing heat treatment is a temperature that is 300° C. or more and 750° C. or less, a peak of the oxygen concentration appears, and hence it can be understood the second heat treatment conditions according to the present invention are met. Further, it is more desirable for the temperature of the precipitate nucleation step in the oxygen securing heat treatment (the second heat treatment) to be 400° C. or more and 700° C. or less.

Example 2

Comparative Example 2

A p-type silicon single crystal ingot having oxygen concentration of $6.5 \times 10^{17}$ atoms/cm$^3$ and resistivity of 20 Ωcm was grown by the CZ method and sliced into a wafer shape, subjected to chamfering, lapping, and etching, then etched wafer was subjected to double-side polishing on both front and back sides thereof, and one main surface of double-side polished wafer was subjected to final mirror polishing. As a result, each double-side polished wafer (a DSP wafer) having a diameter of 12 inches (300 mm) and a thickness of 775 μm was prepared.

Subsequently, a commercially available RTA apparatus (Helios manufactured by Mattson) was used to perform a rapid heating/rapid cooling heat treatment (the RTA treatment), i.e., an oxygen inward diffusion heat treatment for increasing a temperature from a room temperature to X° C. in a 100% oxygen atmosphere at a temperature increasing rate of 50° C./second, holding each wafer for 10 seconds, and then lowering the temperature to 800° C. at a temperature falling rate of 30° C./second with respect to the plurality of DSP wafers. The X° C. was each of 1300° C., 1320° C., 1330° C., and 1350° C. One of the wafers subjected to the oxygen inward diffusion heat treatment at each temperature was sampled and determined as a sample 1.

Then, a commercially available vertical furnace (VERTEX-III manufactured by Kokusai Electric Inc.) was used with respect to each pair of wafers subjected to the RTA treatment (the oxygen inward diffusion heat treatment), and each pair of wafers was held in an N$_2$ gas atmosphere having oxygen concentration of 5% in the furnace at 450° C. for four hours (the oxygen securing heat treatment) and then taken out. A first one of each pair of wafers was determined as a sample 2. A second wafer was put into the furnace held in the N$_2$ gas atmosphere having oxygen concentration of 5% at 600° C. by using the commercially available vertical furnace (VERTEX-III manufactured by Kokusai Electric Inc.), a temperature was increased to 800° C. at 5° C./minute, the sample was held at 800° C. for four hours, the temperature was increased to 1000° C. at 5° C./minute, then an oxide precipitate actualizing heat treatment for holding the wafer for 16 hours was added, the temperature was lowered to 600° C. at 3° C./minute, and the wafer was taken out of the furnace and determined as a sample 3.

Moreover, the sample 2 was subjected to selective etching, whether defects were produced on the surfaces was checked, but the surface defects were not detected from all the samples.

Additionally, an oxygen concentration distribution of the sample 1 in a depth direction was measured by the SIMS, an oxygen concentration distribution of the sample 3 in the depth direction was measured by the SIMS and a BMD distribution of the sample 3 in the depth direction was observed based on preferential etching of a cross section.

Figure 5:
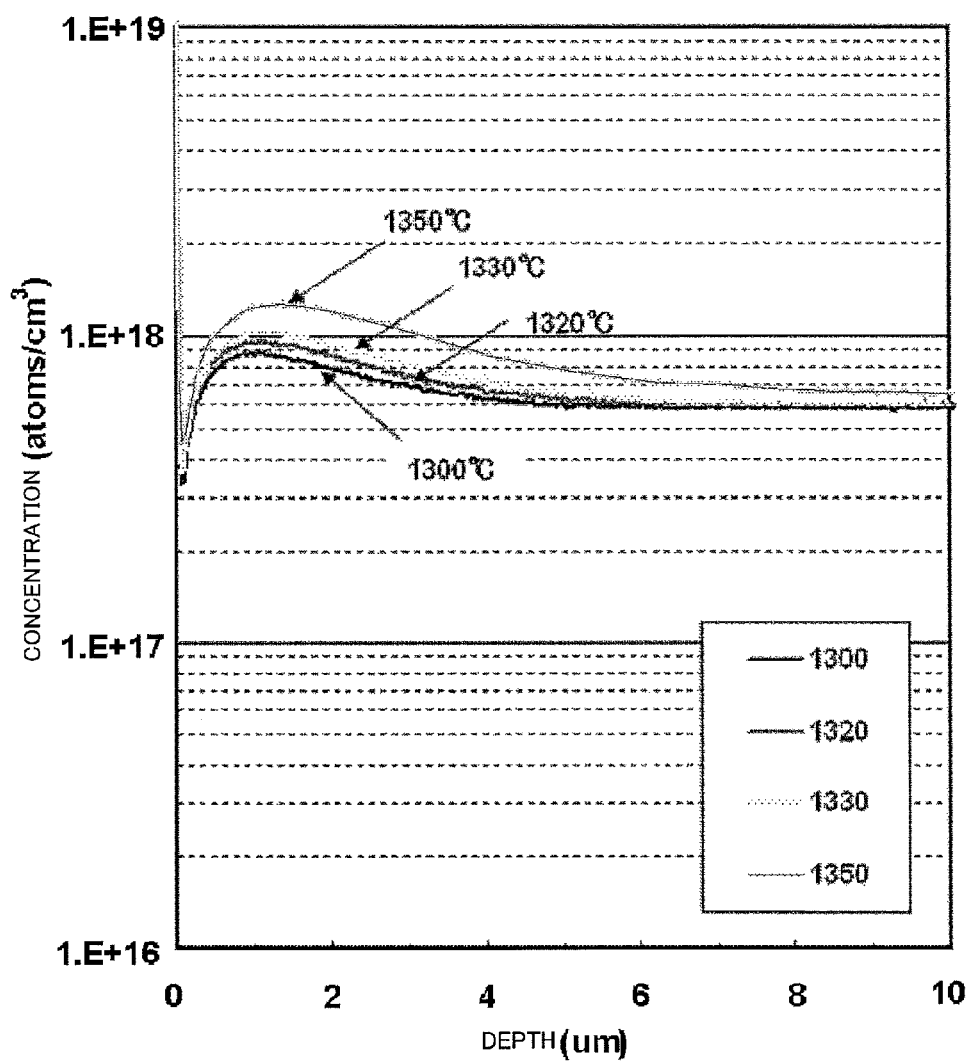
FIG. 5 shows a depth direction profile of oxygen concentration of a sample 1 (after the rapid heating/rapid cooling heat treatment) in each of Example 2 and Comparative Example 2.

FIG. 5 shows each depth direction profile of oxygen concentration of the sample 1 (after the rapid heating/rapid cooling heat treatment). All profiles show distributions each having peak concentration at a depth of approximately 1 μm from the wafer surface.

Figure 6:
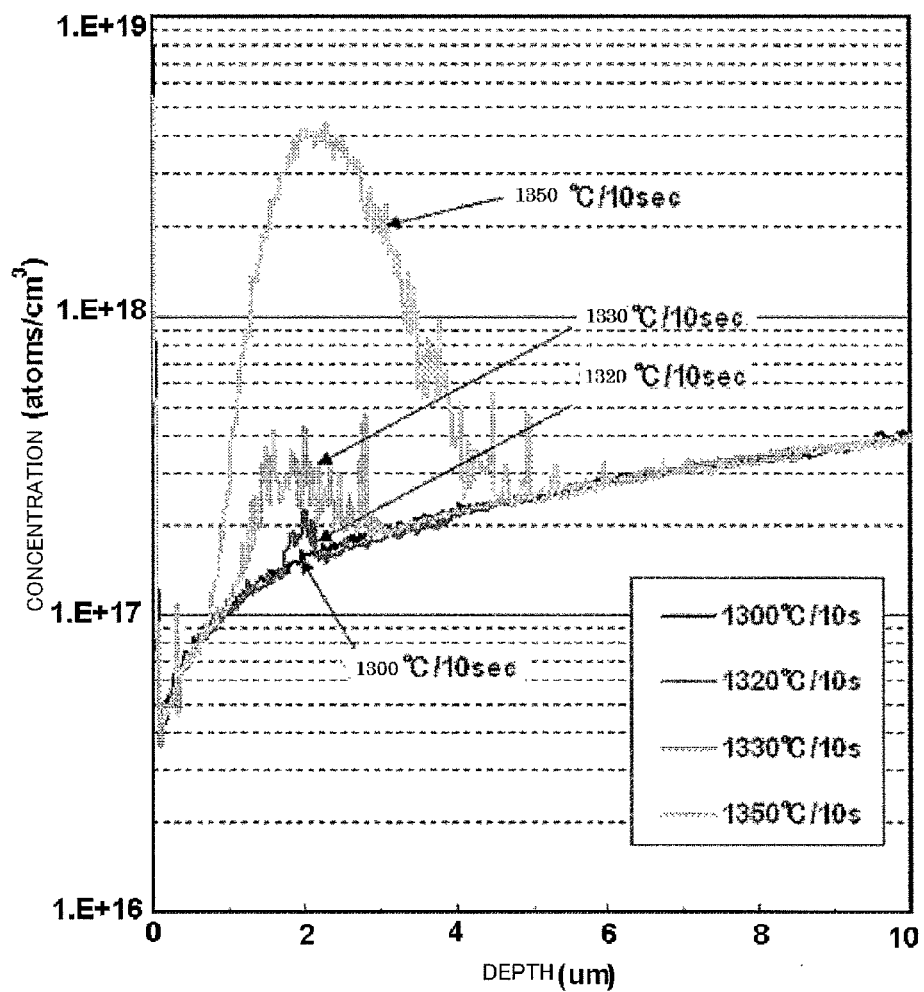
FIG. 6 shows a depth direction profile of oxygen concentration of a sample 3 (after performing the rapid heating/rapid cooling heat treatment, the an oxygen securing heat treatment, and the oxide precipitate actualizing heat treatment) in each of Example 2 and Comparative Example 2.

FIG. 6 shows each depth direction profile of oxygen concentration of the sample 3 (after performing the rapid heating/rapid cooling heat treatment, the oxygen securing heat treatment, and the oxide precipitate actualizing heat treatment). When the oxygen inward diffusion temperature is 1320° C. or more, a peak of the oxygen concentration appears. Comparing a full-width at half maximum of the peak concentration with that of the sample 1, the full-width at half maximum was reduced from 2.2 μm to 0.27 μm when the oxygen inward diffusion heat treatment temperature was 1320° C., and the full-width at half maximum was reduced from 2.4 μm to 0.86 μm when the oxygen inward diffusion heat treatment temperature was 1330° C., and the full-width at half maximum was reduced from 2.9 μm to 1.6 μm when the oxygen inward diffusion heat treatment temperature was 1350° C. On the other hand, the peak concentration was annihilated when the oxygen inward diffusion temperature was 1300° C., and a so-called profile according to outward diffusion is provided.

Figure 7:
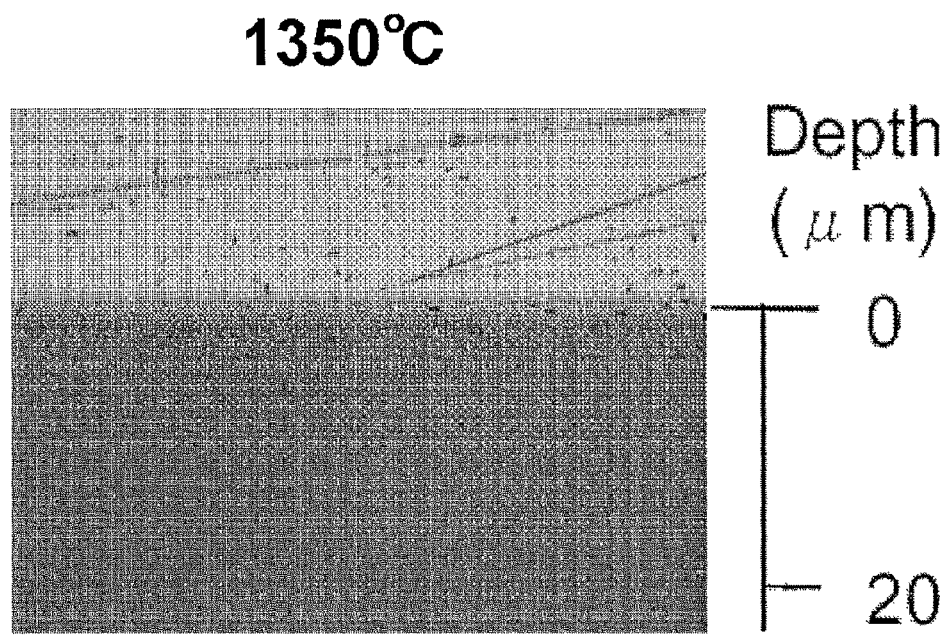
FIG. 7 is an observation view of a result of preferential etching with respect to a cross section of the sample 3 (after performing the rapid heating/rapid cooling heat treatment, the an oxygen securing heat treatment, and the oxide precipitate actualizing heat treatment) when an oxygen inward diffusion temperature is 1350° C. in each of Example 2 and Comparative Example 2.

FIG. 7 shows a result of selective etching relative to a cross section of the sample 3 when the oxygen inward diffusion temperature was 1350° C. As obvious from FIG. 7, it can be understood that a high-concentration BMD layer is formed at a depth of 2 μm from the surface in a narrow region having a width of several μm. Although the similar high-density BMD layer was observed when the oxygen inward diffusion heat treatment was effected at 1320° C. or more, but it was not observed in case of 1300° C.

Figure 8:
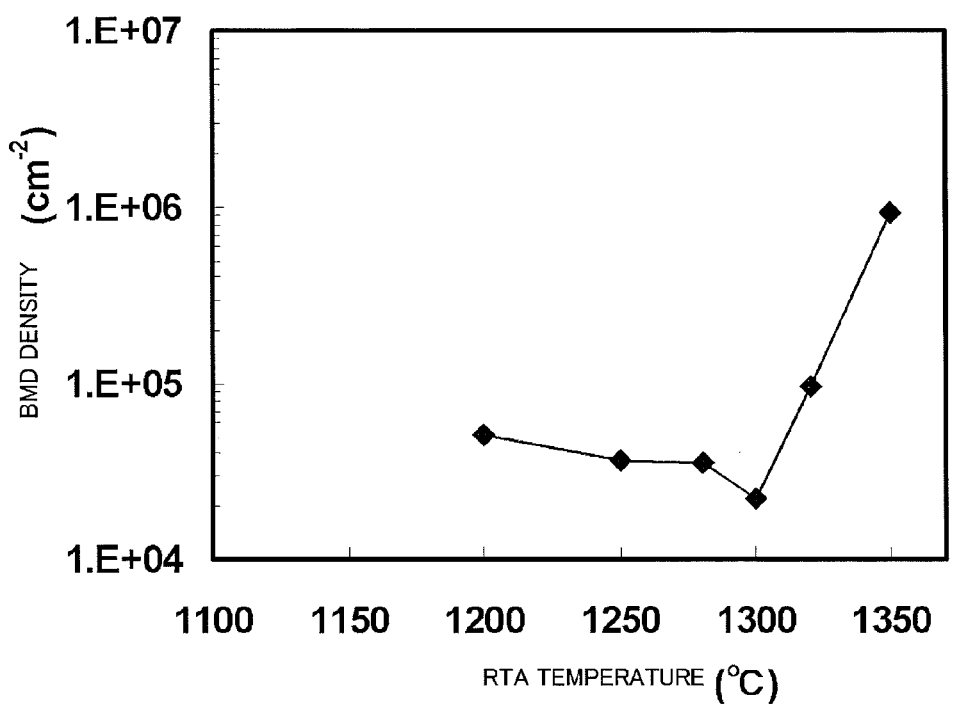
FIG. 8 shows BMD density at a position of a depth 100 μm of the sample 3 (after performing the rapid heating/rapid cooling heat treatment, the an oxygen securing heat treatment, and the oxide precipitate actualizing heat treatment) in each of Example 2 and Comparative Example 2.

FIG. 8 shows BMD density at a position of a depth 100 μm of the sample 3. The BMD density at the depth of 100 μm represents whether oxygen originally present in the bulk rather than oxygen in the high-concentration oxygen layer inwardly diffused in the surface layer by the RTA treatment (the oxygen inward diffusion heat treatment) has formed BMDs. FIG. 8 also shows BMD density of the sample subjected to the RTA treatment (the oxygen inward diffusion heat treatment) at each of 1200° C., 1250° C., and 1280° C. as reference.

As obvious from FIG. 8, in case of the sample subjected to the RTA treatment (the oxygen inward diffusion heat treatment) in the 100% oxygen atmosphere, the BMD density decreases as the treatment temperature rises up to 1300° C., and knowledge in the prior art is reproduced. That is, it can be considered that oxygen precipitation was suppressed by injecting interstitial silicon from the surface by the RTA treatment in the oxygen atmosphere. On the other hand, when the temperature exceeded 1300° C., as different from the knowledge in the prior art, the BMD showed an increase tendency. Although a reason of this tendency is not clear, it can be considered that injection of vacancies occurred at a higher temperature than 1300° C. and hence oxygen precipitation was enhanced.

As a result, when the first heat treatment is the RTA treatment (the oxygen inward diffusion heat treatment) at 1320° C. or a higher temperature, concentration of oxygen injected by the inward diffusion increases, and a very high degree of supersaturation of oxygen can be achieved by the subsequent oxygen securing heat treatment (450° C. in this case) as a result of likewise injecting vacancies, and a synergistic effect that precipitation is facilitated by an influence of the vacancies can be obtained.

Example 3

Comparative Example 3

A p-type silicon single crystal ingot having oxygen concentration of $6.5 \times 10^{17}$ atoms/cm$^3$ and resistivity of 20 Ωcm was grown by the CZ method and sliced into a wafer shape, subjected to chamfering, lapping, and etching, then etched wafer was subjected to double-side polishing on both front and back sides thereof, and one main surface of double-side polished wafer was subjected to final mirror polishing. As a result, each double-side polished wafer (a DSP wafer) having a diameter of 12 inches (300 mm) and a thickness of 775 μm was prepared.

Subsequently, a commercially available RTA apparatus (Helios manufactured by Mattson) was used to perform a rapid heating/rapid cooling heat treatment (the RTA treatment), i.e., an oxygen inward diffusion heat treatment for increasing a temperature from a room temperature to X° C. in an Ar gas atmosphere having oxygen concentration of 19% at a temperature increasing rate of 50° C./second, holding this state for 10 seconds, and then lowering the temperature to 800° C. at a temperature falling rate of 30° C./second with respect to the plurality of DSP wafers. The X° C. was each of 1250° C., 1270° C., 1290° C., and 1310° C. One of the wafers subjected to the oxygen inward diffusion heat treatment at each temperature was sampled and determined as a sample 1.

Then, a commercially available vertical furnace (VERTEX-III manufactured by Kokusai Electric Inc.) was used with respect to each pair of wafers subjected to the RTA treatment (the oxygen inward diffusion heat treatment), and each pair of wafers was held in an N$_2$ gas atmosphere having oxygen concentration of 5% in the furnace at 450° C. for four hours (the oxygen securing heat treatment) and then taken out. A first one of each pair of wafers was determined as a sample 2. A second wafer was put into the furnace held in the N$_2$ gas atmosphere having oxygen concentration of 5% at 600° C. by using the commercially available vertical furnace (VERTEX-III manufactured by Kokusai Electric Inc.), a temperature was increased to 800° C. at 5° C./minute, the sample was held at 800° C. for four hours, the temperature was increased to 1000° C. at 5° C./minute, then an oxide precipitate actualizing heat treatment for holding the wafer for 16 hours was added, the temperature was lowered to 600° C. at 3°/minute, and the wafer was taken out of the furnace and determined as a sample 3.

Moreover, the sample 2 was subjected to selective etching, whether defects were produced on the surfaces was checked, but the surface defects were not detected from all the samples.

An oxygen concentration distribution of the sample 1 in a depth direction was measured by the SIMS, an oxygen concentration distribution of the sample 3 in the depth direction was measured by the SIMS and a BMD distribution of the sample 3 in the depth direction was observed based on selective etching of a cross section.

Table 1 shows full-width at half maximum obtained from the oxygen concentration profile of the sample 1 (after the oxygen inward diffusion heat treatment), presence/absence of oxygen concentration peaks of the sample 3, and full-width at half maximum obtained from the oxygen concentration profile of the sample 3 when the oxygen concentration peaks appear.

TABLE 1

| | Sample 1 | Sample 3 | |
|---|---|---|---|
| RTA temperature (° C.) | Full-width at half maximum of peak oxygen (μm) | Presence/ absence of oxygen concentration peak | Full-width at half maximum of peak oxygen (μm) |
| 1250 | 1.01 | Absent | — |
| 1270 | 1.05 | Absent | — |
| 1290 | 1.08 | Present | 0.21 |
| 1310 | 1.10 | Present | 0.86 |

As obvious from Table 1, when the RTA temperature (a temperature of the oxygen inward diffusion heat treatment) is a high temperature equal to or higher than 1290° C., the oxygen concentration profile of the sample 3 has a peak, and each full-width at half maximum is smaller than that of the sample 1, which obviously corresponds to the heat treatment conditions of the present invention. On the other hand, in case of less than 1290° C., the peak of the oxygen concentration profile of the sample 3 is annihilated, and the usual oxygen concentration distribution according to the outward diffusion of oxygen is provided, which does not correspond to the heat treatment conditions of the present invention.

Figure 9:
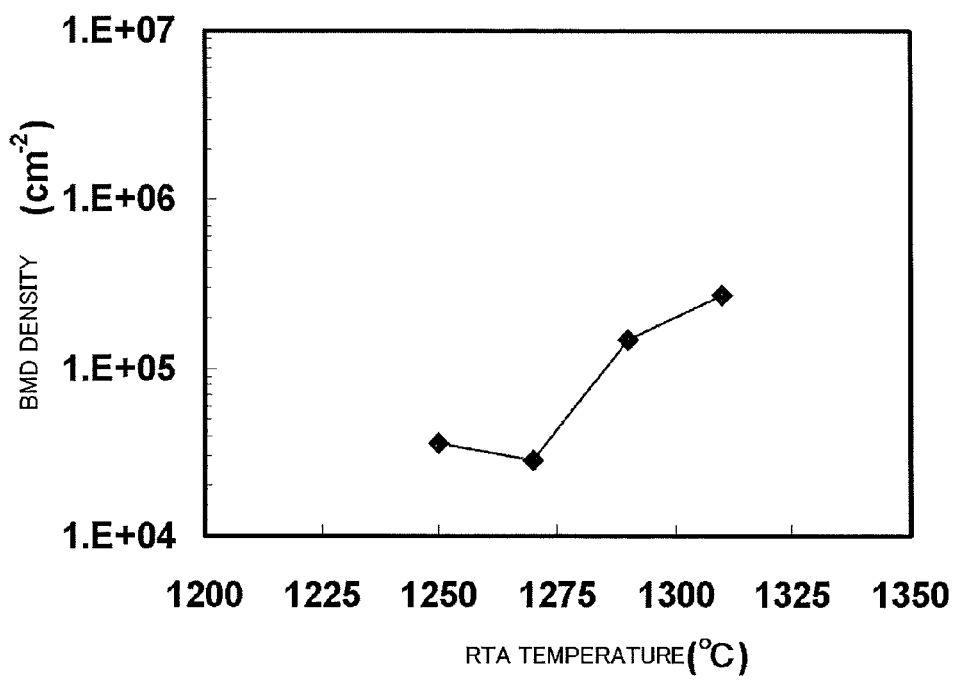
FIG. 9 is a graph showing relation between BMD density at a position of a depth 100 μm of a sample 3 (after performing the rapid heating/rapid cooling heat treatment, the oxygen securing heat treatment, and the oxide precipitate actualizing heat treatment) and an RTA temperature in each of Example 3 and Comparative Example 3.

FIG. 9 shows the BMD density and the RTA temperature at a position of a depth 100 μm of the sample 3.

As obvious from FIG. 9, in case of the sample subjected to the RTA treatment in the Ar gas atmosphere having oxygen concentration of 19%, since the BMD density decreases as the RTA temperature rises up to 1270° C., it can be considered that oxygen precipitation is suppressed by injecting interstitial silicon from the surface. On the other hand, when the RTA temperature exceeds 1270° C., the BMDs show an increase tendency.

In case of performing the RTA treatment in the 100% oxygen atmosphere, the BMDs increased when the RTA temperature exceeded 1300° C. (FIG. 8), but oxygen precipitation was enhanced from a lower temperature of 1270° C. in case of the Ar gas atmosphere containing oxygen of 19% (FIG. 9). As a result, when the RTA treatment (the oxygen inward diffusion heat treatment) was performed in the atmosphere containing oxygen of less than 20%, oxygen precipitation advances at a lower temperature than that in the RTA treatment in the atmosphere containing oxygen of 100%, and hence it can be considered that the HD-BMD layer is formed when the RTA temperature is 1290° C. or more.

Examples 4 and 5

Comparative Examples 4 to 6

A p-type silicon single crystal ingot having oxygen concentration of $6.5 \times 10^{17}$ atoms/cm$^3$ and resistivity of 20 Ωcm was grown by the CZ method and sliced into a wafer shape, subjected to chamfering, lapping, and etching, then etched wafer was subjected to double-side polishing on both front and back sides thereof, and one main surface of double-side polished wafer was subjected to final mirror polishing. As a result, each double-side polished wafer (a DSP wafer) having a diameter of 12 inches (300 mm) and a thickness of 775 μm was prepared.

Subsequently, a commercially available RTA apparatus (Helios manufactured by Mattson) was used to perform a rapid heating/rapid cooling heat treatment (the RTA treatment), i.e., an oxygen inward diffusion heat treatment for increasing a temperature from a room temperature to 1350°

C. in a 100% oxygen atmosphere at a temperature increasing rate of 50° C./second, holding each wafer for 10 seconds, and then lowering the temperature to 800° C. at a temperature falling rate of 30° C./second with respect to the plurality of DSP wafers. One of the wafers was sampled and determined as a sample 1, and its oxygen concentration profile was measured by the SIMS. The measured oxygen concentration had peak concentration of $1.2 \times 10^{18}$ atoms/cm$^3$, and a full-width at half maximum of the peak concentration was 2.90 µm.

Subsequently, four wafers that have been subjected to the RTA treatment (the oxygen inward diffusion heat treatment) and one wafer that has not been subjected to the RTA treatment (Ref: Comparative Example 6) were prepared.

A commercially available vertical furnace (VERTEX-III manufactured by Kokusai Electric Inc.) was used to perform the oxygen securing heat treatment (the precipitate nucleus growth step was continuously performed after the precipitate nucleation step) in the N$_2$ gas atmosphere containing oxygen concentration of 5% in the furnace with respect to these wafers. Table 2 shows oxygen securing heat treatment conditions of Examples 4 and 5 and Comparative Examples 4 and 5.

Then, oxide film removal cleaning was performed, a commercially available epitaxial growth apparatus (Centura manufactured by Applied Materials, Inc.) was used to form an epitaxial layer having a thickness of 8 µm, and this wafer was determined as a sample 2.

An oxygen concentration profile of the sample 2 was measured by using the SIMS, and whether defects were present on surfaces was evaluated by selective etching. Presence/absence of an oxygen concentration peak in the oxygen concentration profile of the sample 2 and a full-width at half maximum obtained from the oxygen concentration profile when an oxygen concentration peak appeared were checked. These results are shown in Table 2.

Figure 10:
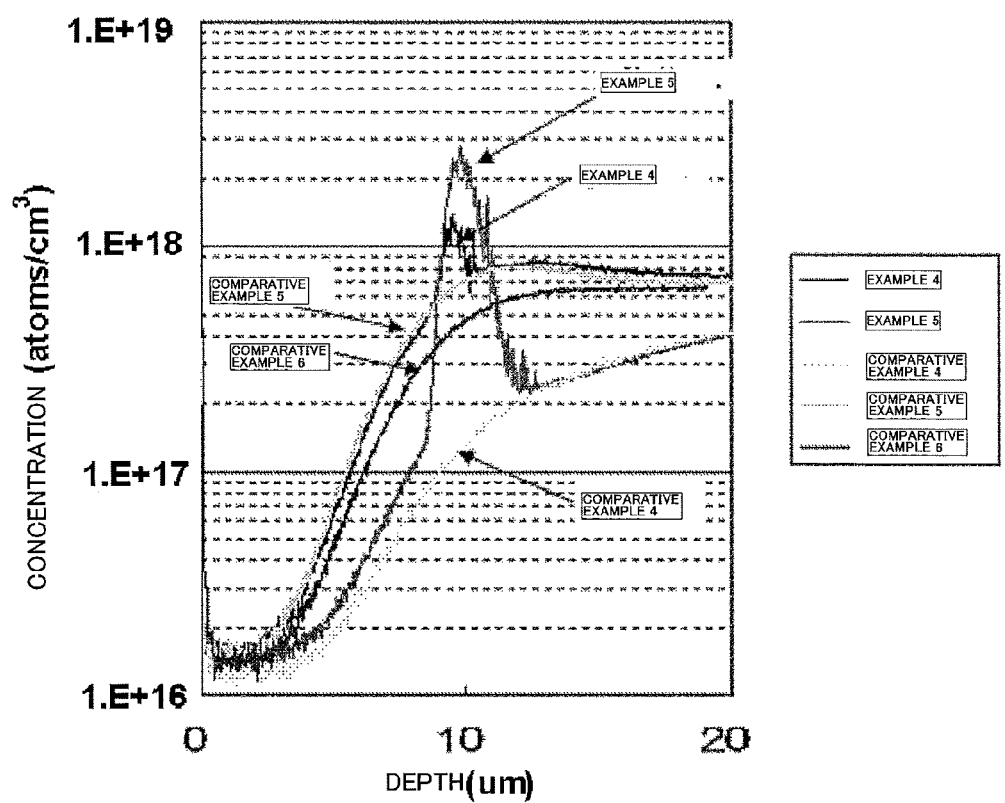
FIG. 10 is a graph showing an SIMS profile of oxygen concentration of a sample 2 (after forming an epitaxial layer) in each of Examples 4 and 5 and Comparative Examples 4 to 6.

FIG. 10 shows SIMS profiles of oxygen concentration of Examples 4 and 5 and Comparative Examples 4 to 6. As obvious from FIG. 10 and Table 2, a clear oxygen concentration peak appears in Example 4. Further, since a full-width at half maximum of the peak oxygen concentration is narrower than a full-width at half maximum 2.90 µm of the sample 1 before the oxygen securing heat treatment, it can be understood this state corresponds to the heat treatment conditions of the present invention. Furthermore, in Example 4, a surface layer defect is not produced either. Moreover, in Example 5, a clear oxygen concentration peak appears, a full-width at half maximum of the peak oxygen concentration is narrower than the full-width at half maximum of the sample 1 before the oxygen securing heat treatment, and hence it can be understood this state corresponds to the heat treatment conditions of the present invention. However, surface layer defects are produced, and hence it can be understood that the conditions of Example 4 are more preferable.

On the other hand, since a peak of the oxygen concentration does not appear in each of Comparative Examples 4 to 6, they do not correspond to the heat treatment conditions of the present invention In Example 4 according to the present invention, before an additional heat treatment, the oxygen concentration is high in the range of 8 µm from the surface, i.e., in the epitaxial layer like Comparative Example 4 or Comparative Example 6. That is because an amount of oxygen inwardly diffused in the wafer during the RTA treatment (the oxygen inward diffusion heat treatment) is higher than concentration of oxygen that is present in the wafer from the beginning and this oxygen has thermally diffused in the epitaxial layer during epitaxial growth.

However, since oxygen radially uniformly and inwardly diffused by the RTA treatment has diffused in the epitaxial layer, a distribution of oxygen in the epitaxial layer is radially uniform. Additionally, in case of Example 4, as obvious from FIG. 10, since the high-density HD-BMD layer is formed immediately below the epitaxial layer by the oxygen securing heat treatment, oxygen that has diffused from the bulk is consumed in order to grow oxide precipitates in this HD-BMD layer even though the additional heat treatment is performed, thereby suppressing diffusion into the epitaxial layer.

Figure 11:
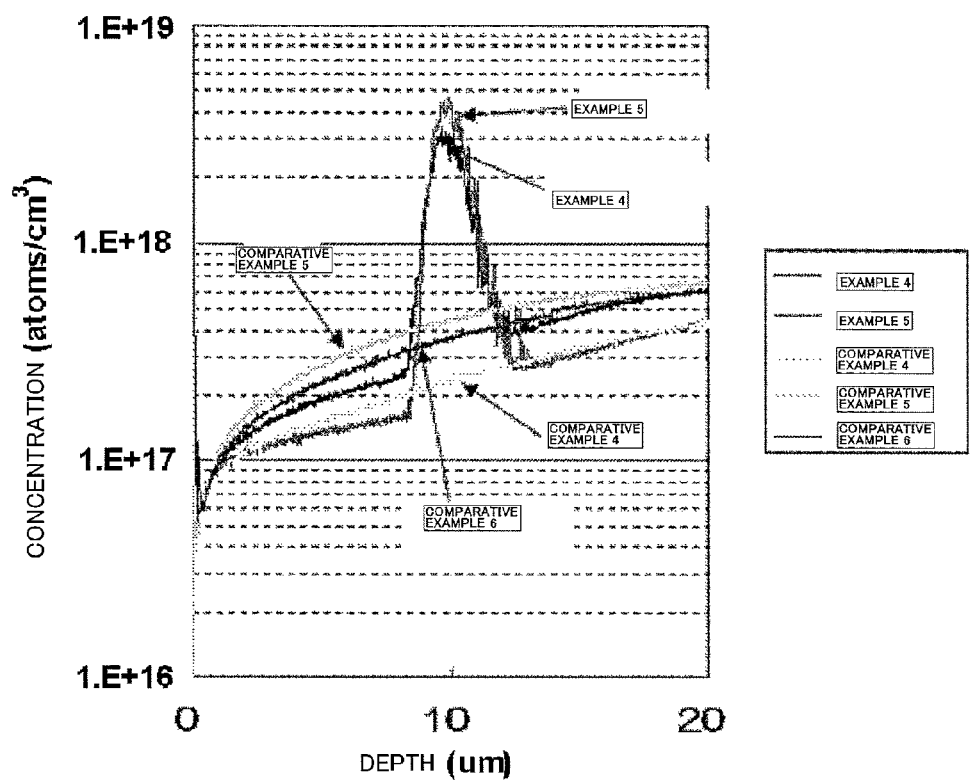
FIG. 11 shows oxygen concentration profile after performing additional heat treatment to the sample 2 (after forming the epitaxial layer) in each of Examples 4 and 5 and Comparative Examples 4 to 6.

FIG. 11 shows oxygen concentration profiles after a heat treatment of 1000° C./8 hours was performed as the additional heat treatment with respect to the samples 2 (after forming the epitaxial layer) of Examples 4 and 5 and Comparative Examples 4 to 6. As a result of the effect provided by the HD-BMD layer, the oxygen concentration in the epitaxial layer after the additional heat treatment is smaller than that in Comparative Example 6 as shown in FIG. 11. As a result, since formation of a donor from oxygen or formation of precipitates in the device process is considerably suppressed, thereby avoiding degradation of the device characteristics.

Further, oxygen that is originally present in the bulk forms radial striped shades (a concentric circle pattern) called striation and, if oxygen is diffused in the epitaxial layer as it is, the shades are used as a template, and oxygen diffused in the

TABLE 2

| | RTA treatment | Temperature and holding time of Precipitate nucleation step | Temperature and holding time of Precipitate nucleus growth step | Presence/ absence of surface defects of sample 2 after preferential etching | Presence/ absence of oxygen concentration peak of sample 2 | Full-width at half maximum of peak oxygen of sample 2 (µm) |
|---|---|---|---|---|---|---|
| Example 4 | Performed | 450° C./4 hours | 800° C./4 hours | Absent | Present | 1.0 |
| Example 5 | Performed | 450° C./4 hours | 800° C./4 hours + 1000° C./ 16 hours | Present (dense) | Present | 1.4 |
| Comparative Example 4 | Performed | 800° C./4 hours | 1000° C./ 16 hours | Absent | Absent | — |
| Comparative Example 5 | Performed | None | None | Absent | Absent | — |
| Comparative Example 6 (Ref) | Not performed | None | None | Absent | Absent | — | epitaxial layer also forms striped shades. As a result, when oxygen diffused in the epitaxial layer during a device heat treatment is turned to a donor or forms a precipitate, they also form a striped distribution, and hence device characteristics appear as stripped characteristic unevenness. However, like the present invention, if diffusion of oxygen originally present in the bulk into the epitaxial layer can be suppressed, the above-described inconveniences can be prevented from occurring. Furthermore, in the samples of Examples 4 and 5, oxygen concentration immediately below the epitaxial layer is considerably increased by the additional heat treatment, and the precipitous high-density BMD layer having the same shape as the oxygen concentration distribution is formed in this region, which effectively acts on proximity gettering. This high-concentration BMD layer is obtained by growing radially uniform oxide precipitate nuclei that are formed with oxygen radially uniformly and inwardly diffused by the RTA treatment, the BMDs are radially uniformly formed, and hence striped BMD shades based on the oxygen striation of the bulk are not provided as different from the prior art.

In Comparative Example 4, a heat treatment temperature of the precipitate nucleation step in the oxygen securing heat treatment is 800° C., the HD-BMD layer is not formed at this stage, and a long-time heat treatment is performed at 1000° C. for 16 hours as the precipitate nucleus growth step in this state (Table 2).

Therefore, oxygen usually outwardly diffuses based on regular diffusion, and oxygen concentration on the surface is greatly lowered. As a result, an amount of oxygen that diffuses in the epitaxial layer is small even during the subsequent epitaxial growth or the additional heat treatment after the epitaxial growth. However, high-density BMDs are not formed immediately below the epitaxial layer, and an effect of proximity gettering cannot be expected. Moreover, BMDs formed at positions apart from the epitaxial layer are formed when oxygen that is originally present in the wafer is actualized as BMDs, and there arises a problem that the stripped BMD shades based on the striation are formed. Additionally, there is also a problem that a radial distribution of oxygen that has diffused in the epitaxial layer similarly turns to a stripped distribution based on the oxygen striation.

Comparative Example 5 provides an epitaxially grown wafer obtained by performing the RTA treatment (the oxygen inward diffusion heat treatment) alone without effecting the oxygen securing heat treatment (Table 2).

In this case, since the oxygen securing heat treatment is not performed, the HD-BMD layer is not formed. Therefore, at the time of the epitaxial growth or the additional heat treatment, oxygen diffuses toward the surface based on the regular outward diffusion, both oxygen originally present in the wafer and oxygen that has inwardly diffused by the RTA treatment outwardly diffuse, both As Epi (after the epitaxial growth) and a sample obtained by performing the additional heat treatment after the epitaxial growth have a maximum amount of oxygen that has diffused in the epitaxial layer (FIGS. 10 and 11). This is a result equivalent to that when oxygen concentration in the wafer is simply increased.

Comparative Example 6 (Ref) provides a regular epitaxial wafer that has not been subjected to both the oxygen inward diffusion heat treatment and the oxygen securing heat treatment (Table 2).

In this case, oxygen originally present in the wafer has just diffused based on the regular outward diffusion, an effect of suppressing diffusion of oxygen into the epitaxial layer is not provided, and hence oxygen concentration in the epitaxial layer (depth of 0 to approximately 8 μm in FIG. 11) after performing the additional heat treatment after the epitaxial growth is higher than that of Comparative Example 4.

In each of Comparative Examples 4 to 6, the oxygen concentration profile gradually increases from the surface toward the bulk, the BMD profile has the same distribution, and hence high-density BMDs cannot be formed in a precipitous and narrow region immediately below the epitaxial layer. Additionally, in each of Comparative Examples 4 to 6, the formed BMDs and the concentration distribution of oxygen that has diffused in the epitaxial layer are non-uniform distributions using the striation as a template.

It is to be noted that the present invention is not restricted to the foregoing embodiment. The foregoing embodiment is just an illustrative example, and any example that has substantially the same configuration and exerts the same functions and effects as the technical concept described in claims of the present invention is included in the technical scope of the present invention.

The invention claimed is:

1. A method for manufacturing a silicon single crystal wafer, wherein
    a first heat treatment for holding a silicon single crystal wafer in an oxygen containing atmosphere at a first heat treatment temperature for 1 to 60 seconds and cooling it to 800° C. or less at a temperature falling rate of 1 to 100° C./second by using a rapid heating/rapid cooling apparatus is performed to inwardly diffuse oxygen and form an oxygen concentration peak region near a surface of the silicon single crystal wafer, and then
    a second heat treatment is performed to agglomerate oxygen in the silicon single crystal wafer into the oxygen concentration peak region, wherein in the second heat treatment, a precipitate nucleation heat treatment is performed at 400 to 700° C. for 2 to 20 hours, and
    wherein conditions of the first and second heat treatments are determined as conditions under which oxygen concentration profiles of the silicon single crystal wafer after the first heat treatment and the silicon single crystal wafer after the first and the second heat treatments or the silicon single crystal wafer subjected to an oxide precipitate actualizing heat treatment after the first and second heat treatments are previously measured and a full-width at half maximum of the oxygen concentration profile of the silicon single crystal wafer after the first and second heat treatments or the silicon single crystal wafer subjected to the oxide precipitate actualizing heat treatment after the first and second heat treatments becomes smaller than a full-width at half maximum of the oxygen concentration profile of the silicon single crystal wafer after the first heat treatment, and the first and second heat treatments are performed under the determined conditions.

2. The method for manufacturing a silicon single crystal wafer according to claim 1,
    wherein oxygen concentration of the silicon single crystal to which the first and second heat treatments are performed is set to $4 \times 10^{17}$ atoms/cm$^3$ (ASTM'79) or more and $16 \times 10^{17}$ atoms/cm$^3$ (ASTM'79) or less.

3. The method for manufacturing a silicon single crystal wafer according to claim 2,
    wherein the conditions of the first and second heat treatments are determined as conditions under which oxide precipitate defects are not formed on the surface of the silicon single crystal wafer after the first and second heat treatments, and the first and second heat treatments are performed under the determined conditions.

4. The method for manufacturing a silicon single crystal wafer according to claim 2,
wherein the first heat treatment is performed in an atmosphere containing oxygen of 20% or more at a first heat treatment temperature that is 1320° C. or more and a silicon melting point or less.

5. The method for manufacturing a silicon single crystal wafer according to claim 2,
wherein the first heat treatment is performed in an atmosphere containing oxygen of 0.01% or more and less than 20% at a first heat treatment temperature that is 1290° C. or more and a silicon melting point or less.

6. The method for manufacturing a silicon single crystal wafer according to claim 1,
wherein, after the first and second heat treatments, an epitaxial layer is formed on a surface of the silicon single crystal wafer.

7. An electronic device, wherein the electronic device is formed on a surface of the epitaxial layer of a silicon single crystal wafer manufactured by the method for manufacturing a silicon single crystal wafer according to claim 6.

8. The method for manufacturing a silicon single crystal wafer according to claim 1,
wherein the conditions of the first and second heat treatments are determined as conditions under which oxide precipitate defects are not formed on the surface of the silicon single crystal wafer after the first and second heat treatments, and the first and second heat treatments are performed under the determined conditions.

9. The method for manufacturing a silicon single crystal wafer according to claim 1,
wherein the first heat treatment is performed in an atmosphere containing oxygen of 20% or more at a first heat treatment temperature that is 1320° C. or more and a silicon melting point or less.

10. The method for manufacturing a silicon single crystal wafer according to claim 1,
wherein the first heat treatment is performed in an atmosphere containing oxygen of 0.01% or more and less than 20% at a first heat treatment temperature that is 1290° C. or more and a silicon melting point or less.

11. The method for manufacturing a silicon single crystal wafer according to claim 1,
wherein, in the second heat treatment, after the precipitate nucleation heat treatment, a precipitate nucleus growth heat treatment is performed at 800 to 1200° C. for one hour or more.

* * * * *